(12) United States Patent
Cho et al.

(10) Patent No.: US 10,665,617 B2
(45) Date of Patent: May 26, 2020

(54) DISPLAY PANEL AND METHOD FOR MANUFACTURING THE SAME

(71) Applicant: SAMSUNG DISPLAY CO., LTD., Yongin-si, Gyeonggi-do (KR)

(72) Inventors: Yoon-jong Cho, Yongin-si (KR); Seokje Seong, Seongnam-si (KR); Seongjun Lee, Seoul (KR); Yoonjee Shin, Ulsan (KR); Suyeon Yun, Seoul (KR); Wooho Jeong, Anyang-si (KR); Joonhoo Choi, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/139,512

(22) Filed: Sep. 24, 2018

(65) Prior Publication Data
US 2019/0164998 A1 May 30, 2019

(30) Foreign Application Priority Data

Nov. 29, 2017 (KR) .................... 10-2017-0162011

(51) Int. Cl.
*H01L 51/50* (2006.01)
*H01L 27/12* (2006.01)
(Continued)

(52) U.S. Cl.
CPC ......... *H01L 27/124* (2013.01); *G09G 3/3266* (2013.01); *G09G 3/3275* (2013.01);
(Continued)

(58) Field of Classification Search
CPC ............. H01L 27/3276; H01L 51/0097; H01L 2251/5338; H01L 27/124; H01L 27/1218; H01L 51/5253
See application file for complete search history.

(56) References Cited

U.S. PATENT DOCUMENTS

| 8,134,152 B2 | 3/2012 | Choi et al. |
| 2005/0139958 A1 | 6/2005 | Mallikarjunaswamy |

(Continued)

FOREIGN PATENT DOCUMENTS

| EP | 3217265 | 9/2017 |
| EP | 3236309 | 10/2017 |
| KR | 10-2019-0042132 | 4/2019 |

OTHER PUBLICATIONS

European Search Report dated Apr. 12, 2019 in corresponding European Patent Application No. 18209266.8 (9 pages).

*Primary Examiner* — Jaehwan Oh
(74) *Attorney, Agent, or Firm* — F. Chau & Associates, LLC

(57) ABSTRACT

A display panel includes a base layer including a first area and a second area. At least one inorganic layer disposed on the base layer overlaps the first area and the second area. The at least one inorganic layer comprises a lower opening. A first thin-film transistor is disposed on the at least one inorganic layer. The first thin-film transistor includes a silicon semiconductor pattern. A second thin-film transistor is disposed on the at least one inorganic layer. The second thin-film transistor includes an oxide semiconductor pattern. A plurality of insulation layers overlap the first area and the second area. An upper opening extends from the lower opening. A signal line is electrically connected to the second thin-film transistor. An organic layer is disposed in the lower opening and the upper opening. A light emitting element is disposed on the organic layer.

13 Claims, 29 Drawing Sheets

(51) Int. Cl.
  *H01L 27/32*   (2006.01)
  *G09G 3/3266*  (2016.01)
  *G09G 3/3275*  (2016.01)
  *H01L 51/56*   (2006.01)
  *H01L 51/00*   (2006.01)
  *H01L 51/52*   (2006.01)

(52) U.S. Cl.
  CPC ...... *H01L 27/1225* (2013.01); *H01L 27/3272* (2013.01); *H01L 27/3276* (2013.01); *H01L 51/0097* (2013.01); *H01L 51/5012* (2013.01); *H01L 51/5253* (2013.01); *H01L 51/56* (2013.01); *H01L 2251/5338* (2013.01)

(56) References Cited

U.S. PATENT DOCUMENTS

| | | |
|---|---|---|
| 2010/0182223 A1 | 7/2010 | Choi et al. |
| 2014/0217397 A1* | 8/2014 | Kwak ................ H01L 27/1218 257/43 |
| 2015/0115256 A1* | 4/2015 | You .................... H01L 27/3265 257/40 |
| 2015/0206977 A1 | 7/2015 | Katoh et al. |
| 2017/0059906 A1* | 3/2017 | Cho ..................... G02F 1/1339 |
| 2017/0125505 A1* | 5/2017 | Oh ......................... H01L 51/52 |
| 2017/0235325 A1 | 8/2017 | Onoya |
| 2017/0236949 A1 | 8/2017 | Yamazaki et al. |
| 2017/0250289 A1* | 8/2017 | Sugawara ......... H01L 21/02164 |
| 2017/0288005 A1* | 10/2017 | Kawata .............. H01L 27/1248 |
| 2017/0288007 A1* | 10/2017 | Shin ....................... H01L 51/56 |

* cited by examiner

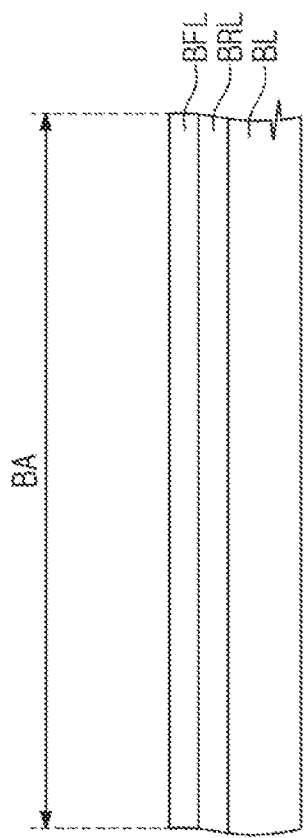
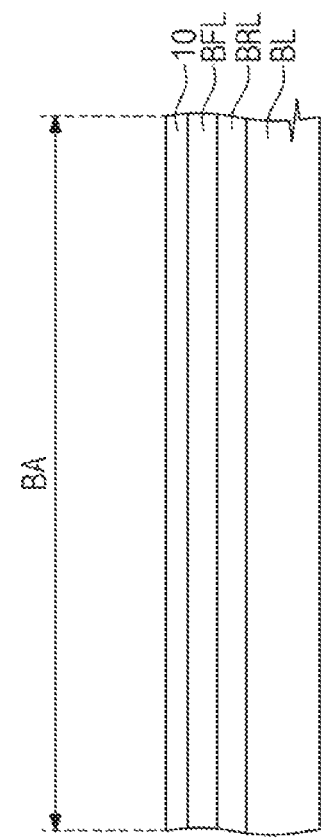
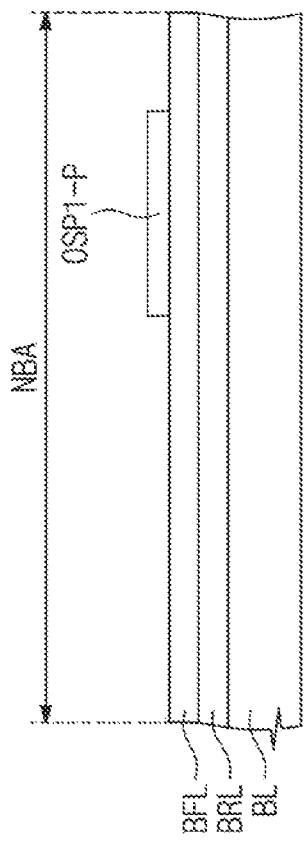
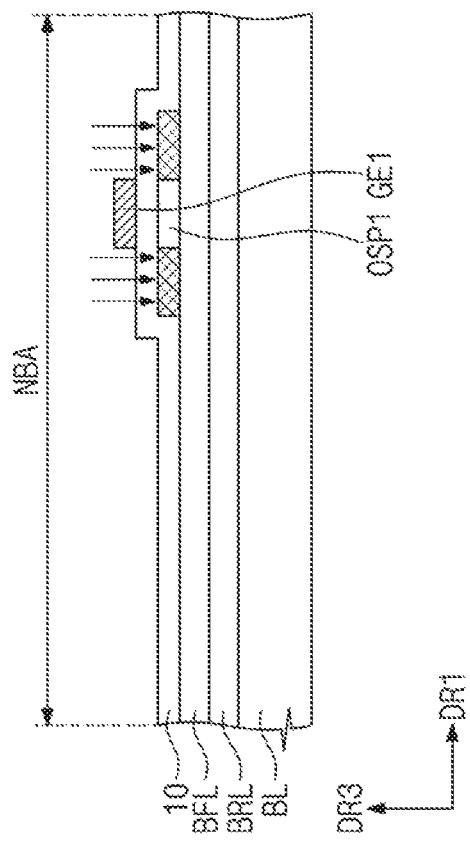
FIG. 5A
FIG. 5B

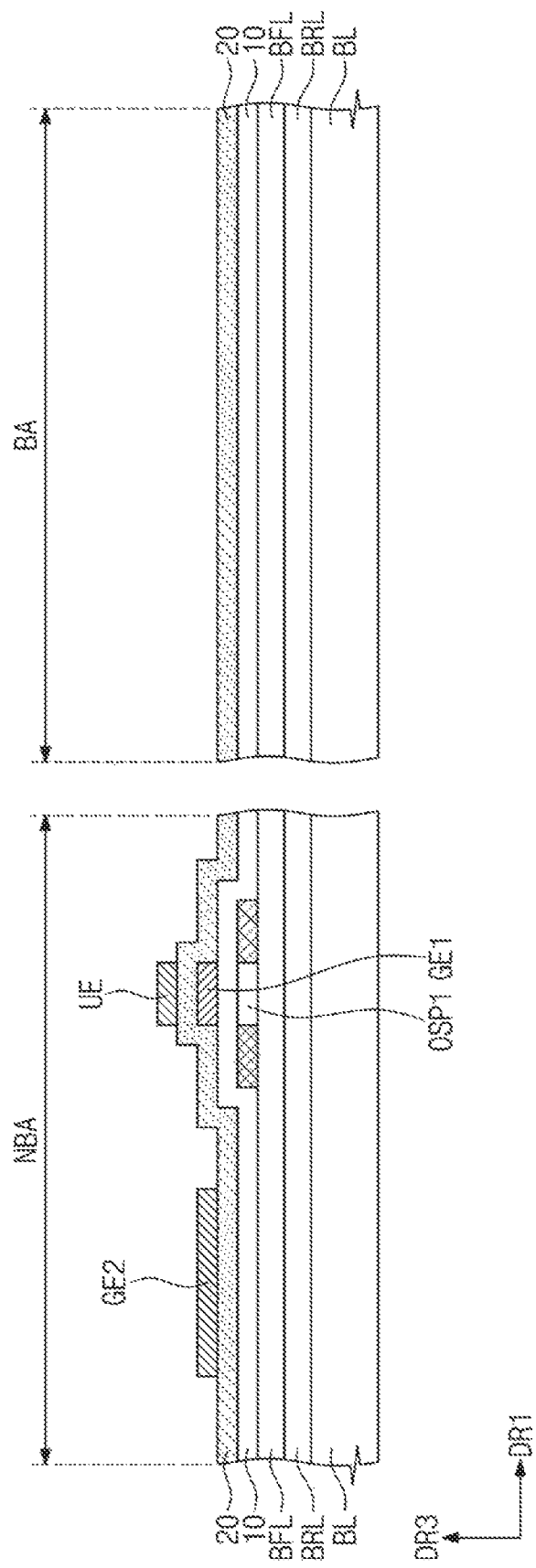

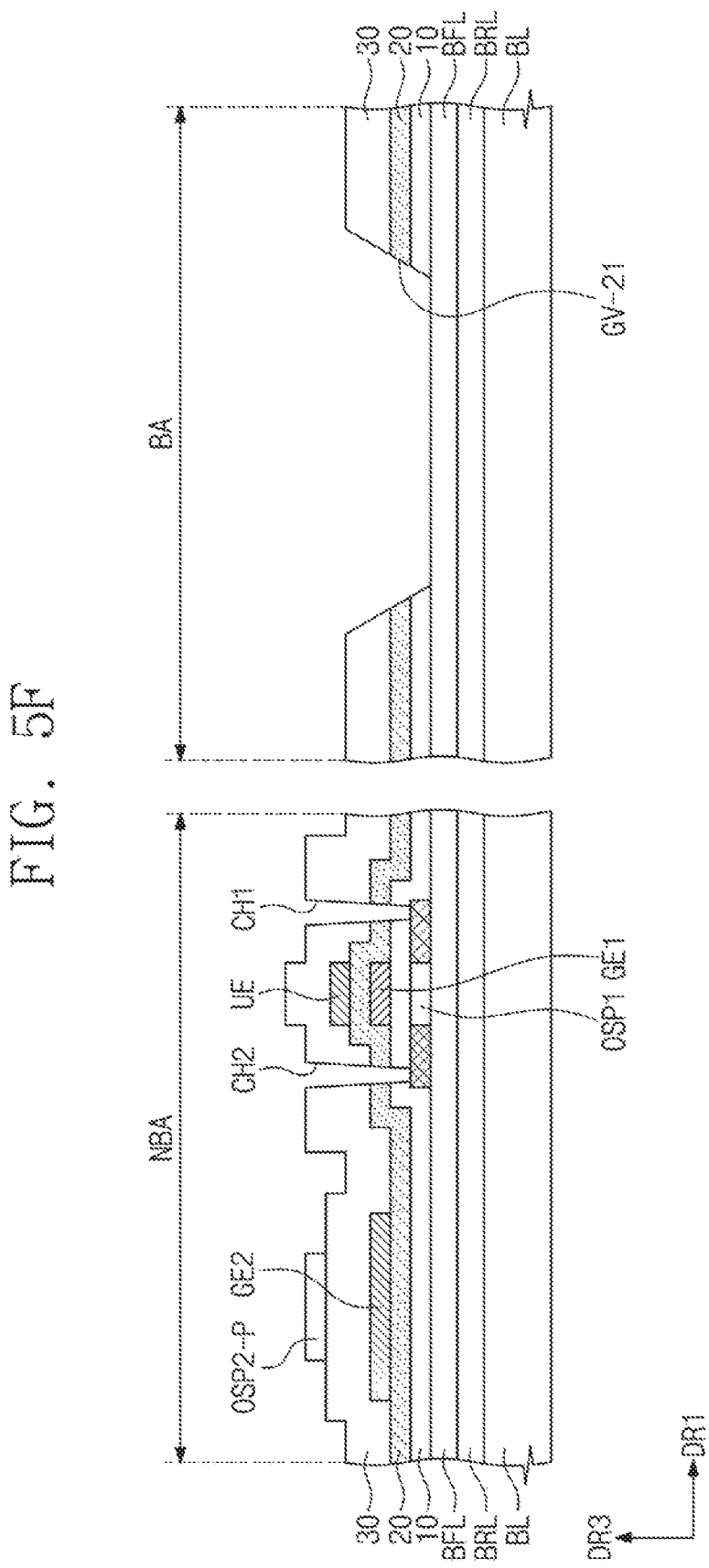

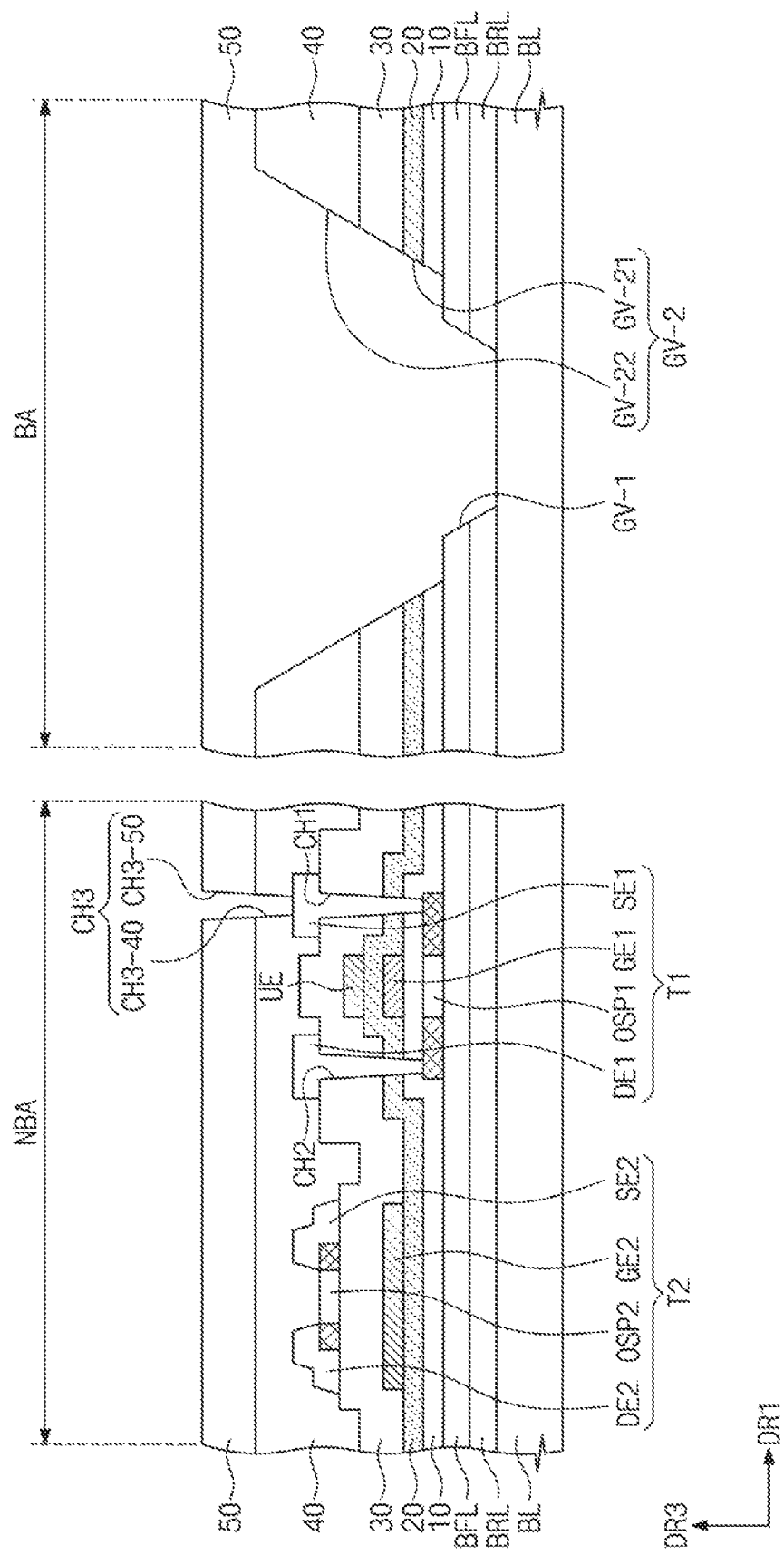

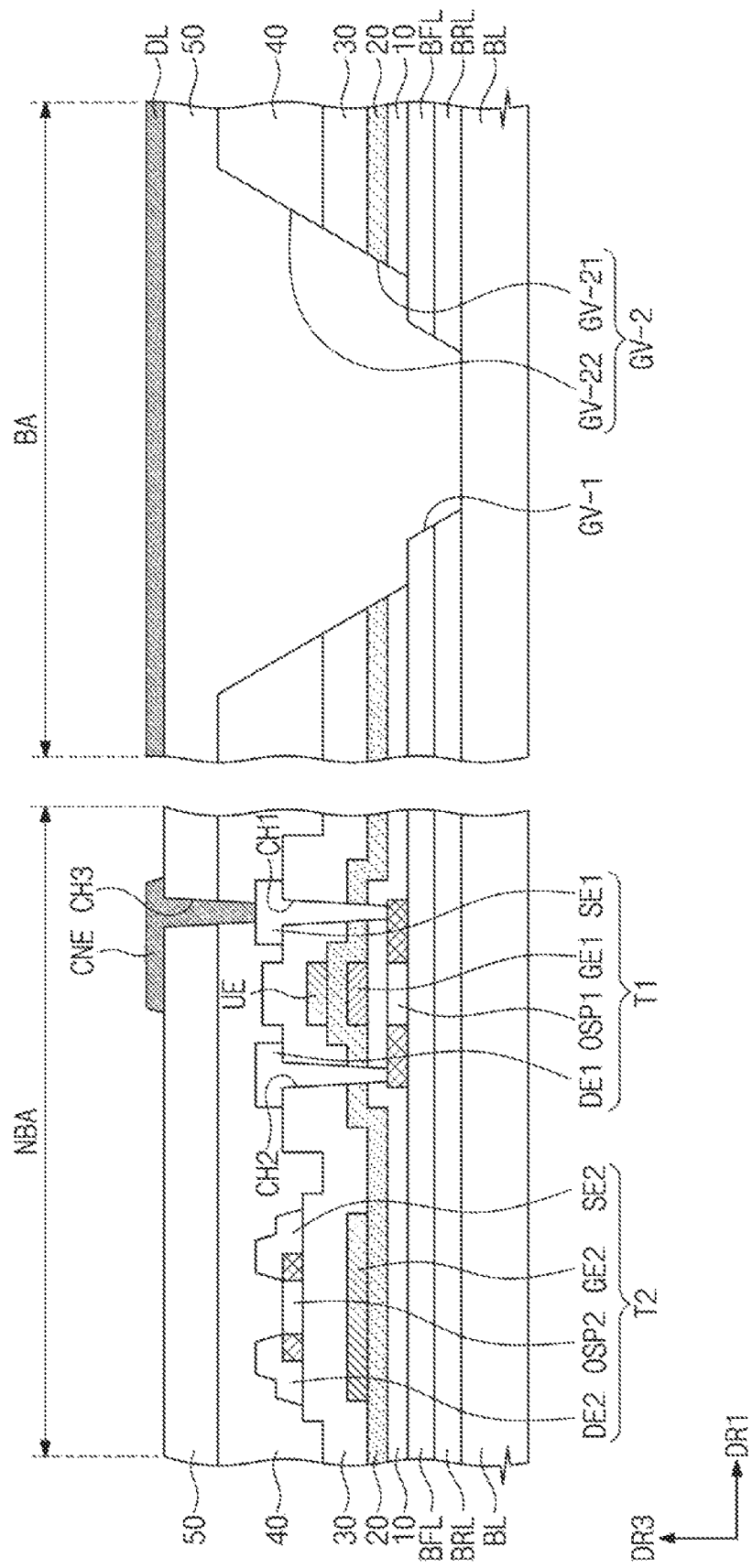

DISPLAY PANEL AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2017-0162011, filed on Nov. 29, 2017, the disclosure of which is incorporated by reference herein in its entirety.

TECHNICAL FIELD

Exemplary embodiments of the present invention relate to a display panel, and more particularly to a method for manufacturing the same.

DISCUSSION OF RELATED ART

A display panel may include a plurality of pixels and a driving circuit (e.g., scan driving circuit or a data driving circuit) controlling the plurality of pixels. Each of the plurality of pixels may include a display element and a driving circuit of the pixel, which may control the display element. The driving circuit of the pixel may include a plurality of thin-film transistors that are relatively closely connected to each other.

The display panel has been developed from a flat-type to various shapes such as a bending-type, a rollable-type, or a foldable-type. As the shape of the display panel is changed, a panel design may also be changed.

SUMMARY

An exemplary embodiment of the present invention provides a display panel having a pixel with increased speed and reliability, and the display panel may have increased flexibility.

An exemplary embodiment of the present invention provides a method for manufacturing a display panel with a reduced number of masks used in a manufacturing process.

In an exemplary embodiment of the present invention, a display panel includes a base layer including a first area and a second area extending from the first area. The second area is bent from the first area. At least one inorganic layer overlaps the first area and the second area. The at least one inorganic layer is disposed on the base layer. A lower opening overlapping the second area is defined in the at least one inorganic layer. A first thin-film transistor is disposed on the at least one inorganic layer. The first thin-film transistor includes a silicon semiconductor pattern overlapping the first area. A second thin-film transistor may have a bottom-gate structure. The second thin-film transistor is disposed on the at least one inorganic layer. The second thin-film transistor includes an oxide semiconductor pattern overlapping the first area. A plurality of insulation layers overlap the first area and the second area. An upper opening extending from the lower opening is defined in the plurality of insulation layers. A signal line is electrically connected to the second thin-film transistor. An organic layer overlaps the first area and the second area. The organic layer is disposed in the lower opening and the upper opening. A light emitting element is disposed on the organic layer and overlaps the first area.

In an exemplary embodiment of the present invention, a portion of the signal line, which overlaps the second area, may be disposed on the organic layer.

In an exemplary embodiment of the present invention, the display panel may include a connection electrode disposed on the organic layer and connected to an output electrode of the first thin-film transistor through a contact hole formed in the organic layer.

In an exemplary embodiment of the present invention, a passivation layer may be disposed on the organic layer.

In an exemplary embodiment of the present invention, an electrode of the light emitting element may be connected to the connection electrode through a contact hole formed in the passivation layer.

In an exemplary embodiment of the present invention, the passivation layer may be disposed on the signal line. A portion of the passivation layer, which overlaps the second area, may be in direct contact with the signal line.

In an exemplary embodiment of the present invention, a first insulation layer may substantially cover an upper surface of the silicon semiconductor pattern of the first thin-film transistor. A second insulation layer may be disposed on the first insulation layer. The second insulation layer may substantially cover upper and side surfaces of a control electrode of the first thin-film transistor. A third insulation layer may be disposed on the second insulation layer. The third insulation layer may substantially cover upper and side surfaces of a control electrode of the second thin-film transistor. A fourth insulation layer may be disposed on the third insulation layer. The fourth insulation layer may substantially cover upper and side surfaces of an input electrode of the second thin-film transistor. The fourth insulation layer may substantially cover upper and side surfaces of an output electrode of the second thin-film transistor. The fourth insulation layer may substantially cover an upper surface of the oxide semiconductor pattern of the second thin-film transistor.

In an exemplary embodiment of the present invention, a first portion and a second portion of the oxide semiconductor pattern may be disposed on the input electrode and the output electrode of the second thin-film transistor, respectively.

In an exemplary embodiment of the present invention, the input electrode and the output electrode of the second thin-film transistor may be disposed above a first portion and a second portion of the oxide semiconductor pattern, respectively. A third portion of the oxide semiconductor pattern may be exposed from the input electrode and the output electrode of the second thin-film transistor.

In an exemplary embodiment of the present invention, the display panel may include an upper electrode disposed between the second insulation layer and the third insulation layer. The upper electrode may overlap the control electrode of the first thin-film transistor.

In an exemplary embodiment of the present invention, the display panel may include a light blocking pattern disposed on the organic layer. The light blocking pattern may overlap the oxide semiconductor pattern of the second thin-film transistor.

In an exemplary embodiment of the present invention, the at least one inorganic layer may include silicon oxide layers and silicon nitride layers disposed alternately with the silicon oxide layers.

In an exemplary embodiment of the present invention, a portion of a top surface of the at least one inorganic layer may be in direct contact with the organic layer.

In an exemplary embodiment of the present invention, a method for manufacturing a display panel includes forming, on a base layer including a first area and a second area extending from the first area, at least one inorganic layer overlapping the first area and the second area along a direction orthogonal to an upper surface of the base layer. The method includes forming a silicon semiconductor pattern on the at least one inorganic layer to overlap the first area along the direction orthogonal to the upper surface of the base layer. The method includes forming a first control electrode on a first insulation layer to overlap the silicon semiconductor pattern along the direction orthogonal to the upper surface of the base layer. The first insulation layer overlaps the first area and the second area along the direction orthogonal to the upper surface of the base layer. The method includes forming a second control electrode spaced apart from the first control electrode on a second insulation layer overlapping the first area and the second area along the direction orthogonal to the upper surface of the base layer. The second insulation layer substantially covers upper and side surfaces of the first control electrode. The method includes forming a third insulation layer overlapping the first area and the second area along the direction orthogonal to the upper surface of the base layer. The third insulation layer substantially covers upper and side surfaces of the second control electrode. The method includes performing a first etching partially removing the first, second and third insulation layers to form a first contact hole and a second contact hole exposing a first portion and a second portion of the silicon semiconductor pattern, respectively. The first etching form a first upper opening exposing the at least one inorganic layer in the second area. The method includes forming an oxide semiconductor pattern overlapping the second control electrode on the third insulation layer along the direction orthogonal to the upper surface of the base layer. The method includes forming a first input electrode and a first output electrode, which are connected to the silicon semiconductor pattern through the first contact hole and the second contact hole, respectively, on the third insulation layer and forming a second input electrode and a second output electrode, which are connected to the oxide semiconductor pattern, on the third insulation layer. The method includes forming a fourth insulation layer on the third insulation layer. The fourth insulation layer overlaps the first area and the second area along the direction orthogonal to the upper surface of the base layer. The method includes performing a second etching partially removing the fourth insulation layer to form a third contact hole exposing the first output electrode in the fourth insulation layer. The second etching includes forming a second upper opening exposing the at least one inorganic layer in the second area. The method includes performing a third etching removing a portion of the at least one inorganic layer, which overlaps the second area, to form a lower opening aligned with the first upper opening along the direction orthogonal to the upper surface of the base layer in the at least one inorganic layer. The method includes forming an organic layer disposed on the fourth insulation layer within the first area and disposed in the first upper opening, the second upper opening, and the lower opening within the second area. The method includes performing a fourth etching partially removing the organic layer to form a fourth contact hole connected to the third contact hole in the organic layer. The method includes forming a light emitting element electrically connected to the first output electrode on the organic layer.

In an exemplary embodiment of the present invention, after the forming of the oxide semiconductor pattern, forming the second input electrode and the second output electrode, which are spaced apart from each other and each of which may overlap the oxide semiconductor pattern along the direction orthogonal to the upper surface of the base layer.

In an exemplary embodiment of the present invention, after the forming of the second input electrode and the second output electrode, which are spaced apart from each other, forming the oxide semiconductor pattern partially overlapping the second input electrode and the second output electrode along the direction orthogonal to the upper surface of the base layer.

In an exemplary embodiment of the present invention, the method may include forming a connection electrode connected to the first output electrode and a signal line overlapping the second area on the organic layer along the direction orthogonal to the upper surface of the base layer. The method may include forming a passivation layer substantially covering upper surfaces of the connection electrode and the signal line on the organic layer. The method may include performing a fifth etching partially removing the passivation layer to form a fifth contact hole exposing the connection electrode. The light emitting element may be connected to the first output electrode through the connection electrode.

In an exemplary embodiment of the present invention, the forming of the light emitting element may include forming a first electrode of the light emitting element connected to the connection electrode on the passivation layer. The forming of the light emitting element may include forming a pixel defining layer having an opening to expose the first electrode of the light emitting element on the passivation layer.

In an exemplary embodiment of the present invention, a portion of the passivation layer, which overlaps the second area along the direction orthogonal to the upper surface of the base layer, may be in direct contact with the signal line.

In an exemplary embodiment of the present invention, in the forming of the second control electrode, an upper electrode overlapping the first control electrode along the direction orthogonal to the upper surface of the base layer may be formed on the second insulation layer.

In an exemplary embodiment of the present invention, the method may include forming a light blocking pattern overlapping the oxide semiconductor pattern on the organic layer along the direction orthogonal to the upper surface of the base layer.

In an exemplary embodiment of the present invention, a portion of a top surface of the at least one inorganic layer may be in direct contact with the organic layer.

In an exemplary embodiment of the present invention, the method may include bending the second area.

In an exemplary embodiment of the present invention, a method for manufacturing a display panel includes forming, on a base layer comprising a first area and a second area extending from the first area, at least one inorganic layer overlapping the first area and the second area along a direction orthogonal to an upper surface of the base layer. The method includes forming first to third insulation layers overlapping the first area and the second area on the at least one inorganic layer along the direction orthogonal to the upper surface of the base layer and a silicon semiconductor pattern overlapping the first area on the at least one inorganic layer along the direction orthogonal to the upper surface of the base layer. The method includes performing a first etching partially removing the first to third insulation layers to expose a portion of the silicon semiconductor pattern and a portion, which overlaps the second area along the direction orthogonal to the upper surface of the base layer, of the at least one inorganic layer. The method includes forming an oxide semiconductor pattern above the first to third insulation layers and a plurality of electrodes connected to the oxide semiconductor pattern and the silicon semiconductor pattern. The method includes forming a fourth insulation layer substantially covering an upper surface of the oxide semiconductor pattern and upper and side surfaces of the plurality of electrodes on the first to third insulation layers. The method includes performing a second etching partially removing the fourth insulation layer so that at least one electrode of the plurality of electrodes and the portion of the at least one inorganic layer, which overlaps the second area along the direction orthogonal to the upper surface of the base layer, are exposed. The method includes performing a third etching partially removing the portion of the at least one inorganic layer, which overlaps the second area along the direction orthogonal to the upper surface of the base layer. The method includes forming an organic layer on the fourth insulation layer within the first area and disposed in an area in which the at least one inorganic layer is removed and an area in which the first to fourth insulation layers are removed within the second area. The method includes performing a fourth etching partially removing the organic layer so that the at least one electrode of the plurality of electrodes is exposed to the organic layer. The method includes forming a light emitting element electrically connected to the at least one electrode of the plurality of electrodes and the signal line on the organic layer. The method includes bending the second area.

In an exemplary embodiment of the present invention, the signal line may be a data line including a first portion connected to a pixel, a second portion and a third portion connected to a signal pad. The second portion may connect the first and third portions to each other.

In an exemplary embodiment of the present invention, a bottom surface of the first portion of the data line facing the base layer may be positioned at a same height above the base layer as a bottom surface of the third portion of the data line facing the base layer.

In an exemplary embodiment of the present invention, a bottom surface of the first portion of the data line facing the base layer may be positioned at a different height above the base layer as a bottom surface of the third portion of the data line facing the base layer.

In an exemplary embodiment of the present invention, the second area may include a curvature area. The second area may have a smaller thickness than a thickness of the first area.

In an exemplary embodiment of the present invention, the curvature area may be permanently maintained in a curved state.

BRIEF DESCRIPTION OF THE FIGURES

The above and other features of the present invention will become more apparent by describing in detail exemplary embodiments thereof with reference to the accompanying drawings, in which:

FIGS. 5A, 5B, 5C, 5D, 5E, 5F, 5G, 5H, 5I, 5J, 5K, 5L, 5M, 5N and 5O are cross-sectional views of a process for manufacturing a display panel according to an exemplary embodiment of the present invention;

DETAILED DESCRIPTION

Figure 1A:
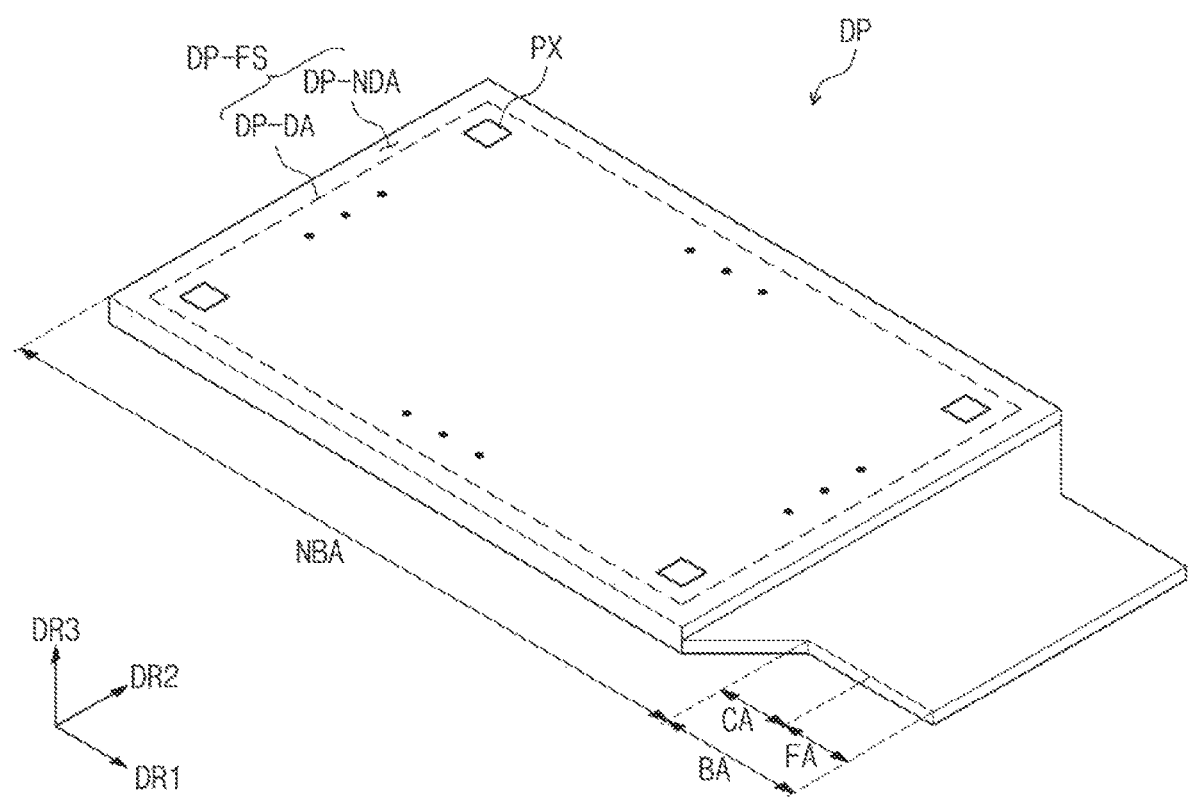
FIGS. 1A and 1B are perspective views of a display panel according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

It will be understood that when an element such as a region, layer, or portion is referred to as being "on" another element, it may be directly on the other element or intervening elements may also be present.

Like reference numerals may refer to like elements throughout the specification and drawings. Sizes of elements in the drawings may be exaggerated for clarity of description.

It will be understood that although the terms "first" and "second" may be used herein to describe various components, these components should not be limited by these terms.

Figure 1B:
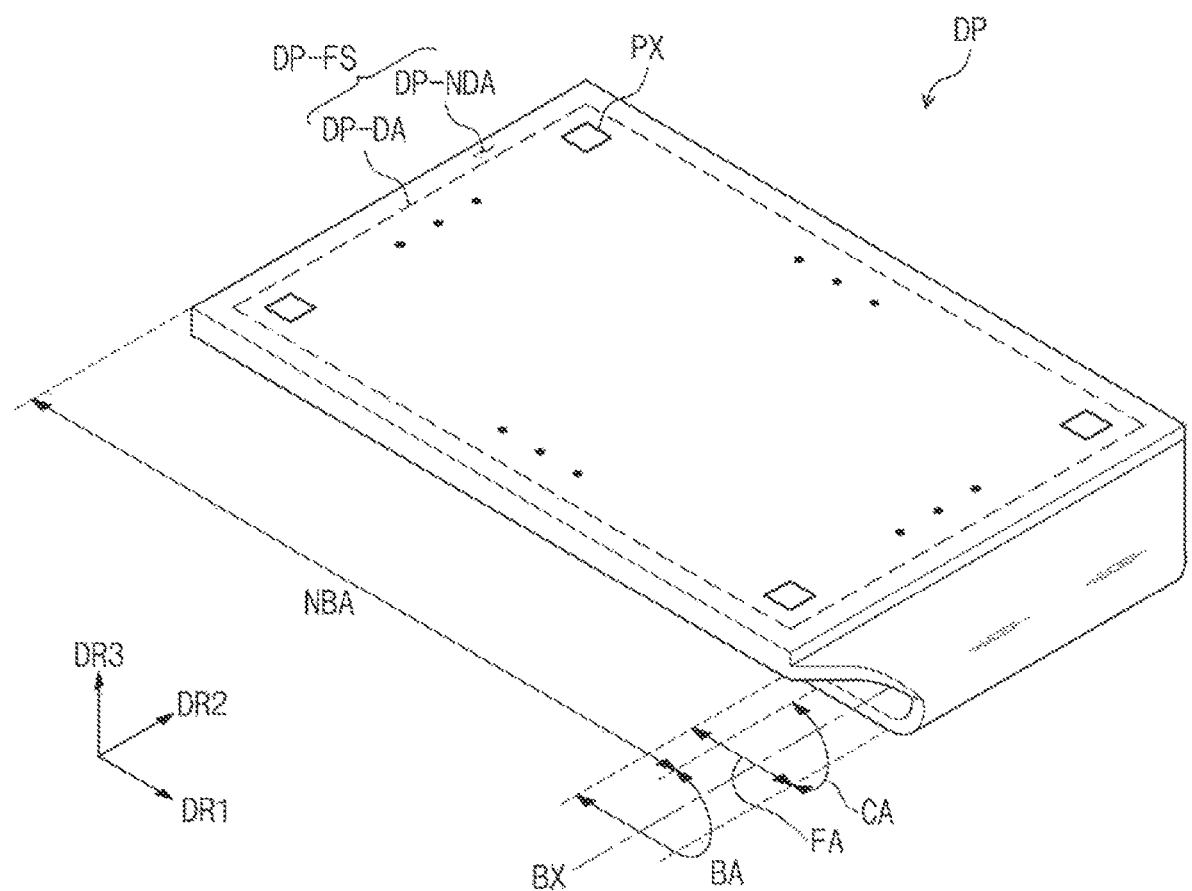
Figure 2:
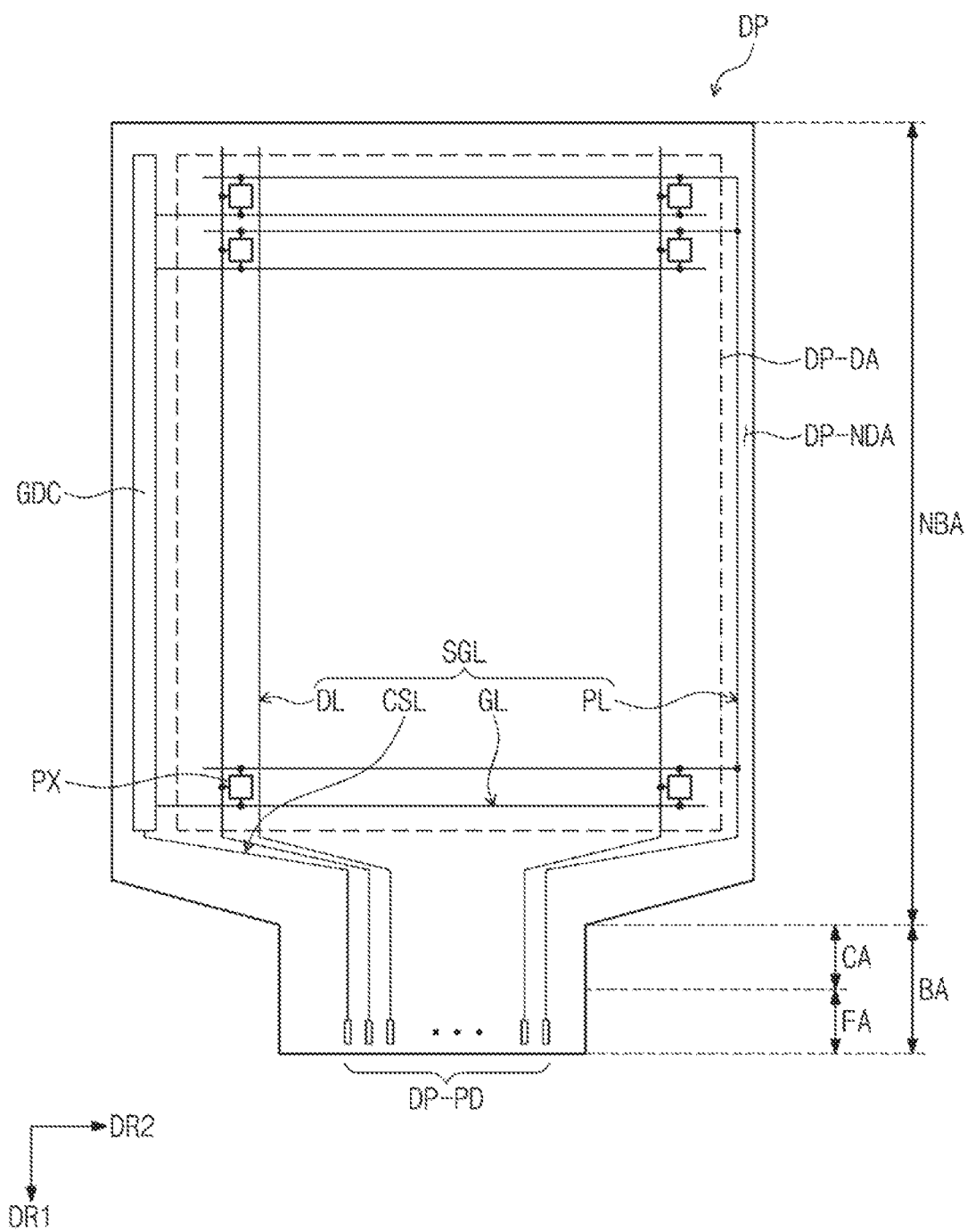
FIG. 2 is a plan view of a display panel according to an exemplary embodiment of the present invention.

FIGS. 1A and 1B are perspective views of a display panel according to an exemplary embodiment of the present invention. FIG. 2 is a plan view of the display panel according to an exemplary embodiment of the present invention. FIG. 2 schematically illustrates a connection relationship between pixels PX, a driving circuit GDC, and a signal line SGL.

In an unfolded state, a display panel DP may include a front surface DP-FS that is parallel to a surface defined by a first directional axis DR1 and a second directional axis DR2. As an example, the front surface DP-FS may have a substantially rectangular shape; however, exemplary embodiments of the present invention are not limited thereto. A normal direction of the front surface DP-FS of the display surface DS, for example, a thickness direction of the display panel DP, may extend along a third directional axis DR3. Thus, the third directional axis DR3 may be orthogonal to the first direction axis DR1 and the second directional axis DR2. A front surface and a bottom surface (e.g., a rear surface) of the display panel DP may face along the third directional axis DR3. Thus, each of a plurality of stacked layers of the display panel DP may include front and rear surfaces facing along the third direction axis DR 3 (e.g., when the display panel DP is in an unfolded state). The first, second and third directional axes DR1, DR2, and DR3 may be respectively referred to as first, second and third directions herein, and may include like reference numerals herein.

Referring to FIG. 1A, the display panel DP may include a display area DP-DA on which the pixels PX are displayed and a non-display area DP-NDA on the front surface DP-FS. The non-display area DP-NDA may be an area on which the pixels are not disposed. Thus, each of the pixels PX may be positioned in the display area DP-DA. On the non-display area DP-NDA, a portion of the signal lines SGL and/or the driving circuit GDC may be disposed.

The display area DP-DA may have a rectangular shape. The non-display area DP-NDA may surround the display area DP-DA (e.g., on four sides of the display area DP-DA) when viewed in a plan view along the third direction DR3. However, exemplary embodiments of the present invention are not limited to particular shapes of the display area DP-DA or the non-display area DP-NDA. For example, the shapes of the display area DP-DA and the non-display area DP-NDA may each be modified, as desired. For example, the non-display area DP-NDA may be disposed on only areas facing each other in the first direction DR1. Alternatively, the non-display area DP-NDA may be disposed on three sides of the display area DP-DA (e.g., not on a side of the display area DP-DA on which a second area BA described in more detail below extends from). As an example, the display area DP-DA may have a circular shape.

According to an exemplary embodiment of the present invention, a portion of the non-display area DP-NDA may have a relatively narrow width (e.g., a length in the second direction DR2) in comparison with that of the display area DP-DA. Thus, a surface area of a bending area, which will be described in more detail below, may be reduced.

Referring to FIG. 1B, the display panel DP may be bent or curved (e.g., to form a 'C' shape), and, as it is bent, the display panel DP may include a first area NBA (e.g., a non-bending area) and a second area BA (e.g., a bending area). The second area BA may include a curvature area CA having a predetermined curvature in a bent state and a facing area FA facing the first area NBA in a bent state. As an example, the display panel DP may be bent along a bending axis BX. The bending axis BX may extend along the second direction DR2. The second direction DR2 may be perpendicular to each of the first direction DR1 and the third direction DR3.

Referring to FIG. 2, the display panel DP may include a driving circuit GDC, a plurality of signal lines SGL (e.g., which may be referred to herein as signal lines), a plurality of signal pads DP-PD (e.g., which may be referred to herein as signal pads), and a plurality of pixels PX (e.g., which may be referred to herein as pixels).

The pixels PX may be divided into a plurality of groups according to colors displayed thereon. The pixels PX may include, e.g., red pixels, green pixels, or blue pixels. The pixels PX may include white pixels. Although the pixels may be divided into different groups according to colors displayed thereon, the pixel driving circuit of the pixels may be the same as each other.

The driving circuit GDC may include a scan driving circuit. The scan driving circuit may generate a plurality of scan signals (e.g., which may be referred to herein as scan signals) and may sequentially output the scan signals to a plurality of scan lines GL (e.g., which may be referred to herein as scan lines). The scan driving circuit may further output another control signal to the driving circuit of the pixels PX.

The scan driving circuits may include a plurality of thin-film transistors that are formed through substantially the same process as that of the driving circuit of the pixels PX, e.g., a low temperature polycrystalline silicon (LTPS) process or a low temperature polycrystalline oxide process.

The signal lines SGL may include scan lines GL, data lines DL, a power line PL, and/or control signal line CSL. Each of the scan lines GL may be connected to a corresponding pixel PX of the pixels PX, and each of the data lines DL may be connected to a corresponding pixel PX of the pixels PX. The power line PL may be connected to the pixels PX. The control signal line CSL may provide control signals to the scan driving circuit. Each of the signal pads DP-PD may be connected to the corresponding signal line of the signal lines SGL.

A circuit board may be electrically connected to the display panel DP. The circuit board may be a rigid circuit board or a flexible circuit board. A driving chip may be mounted to the circuit board.

The driving chip may be mounted to the display panel DP. When the driving chip is mounted to the display panel DP, the design of the signal lines SGL may be modified. The driving chip may be connected to the data lines DL, and a signal line connecting the driving chip to the signal pads DP-PD may be further provided.

Figure 3A:
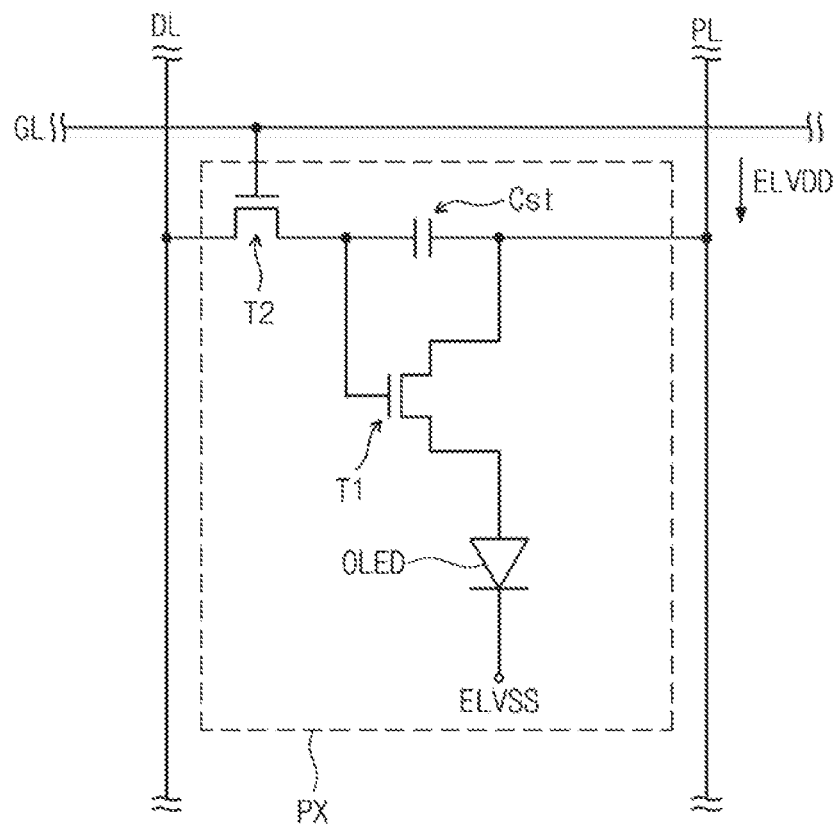
FIG. 3A is an equivalent circuit diagram of a pixel according to an exemplary embodiment of the present invention.
Figure 3B:
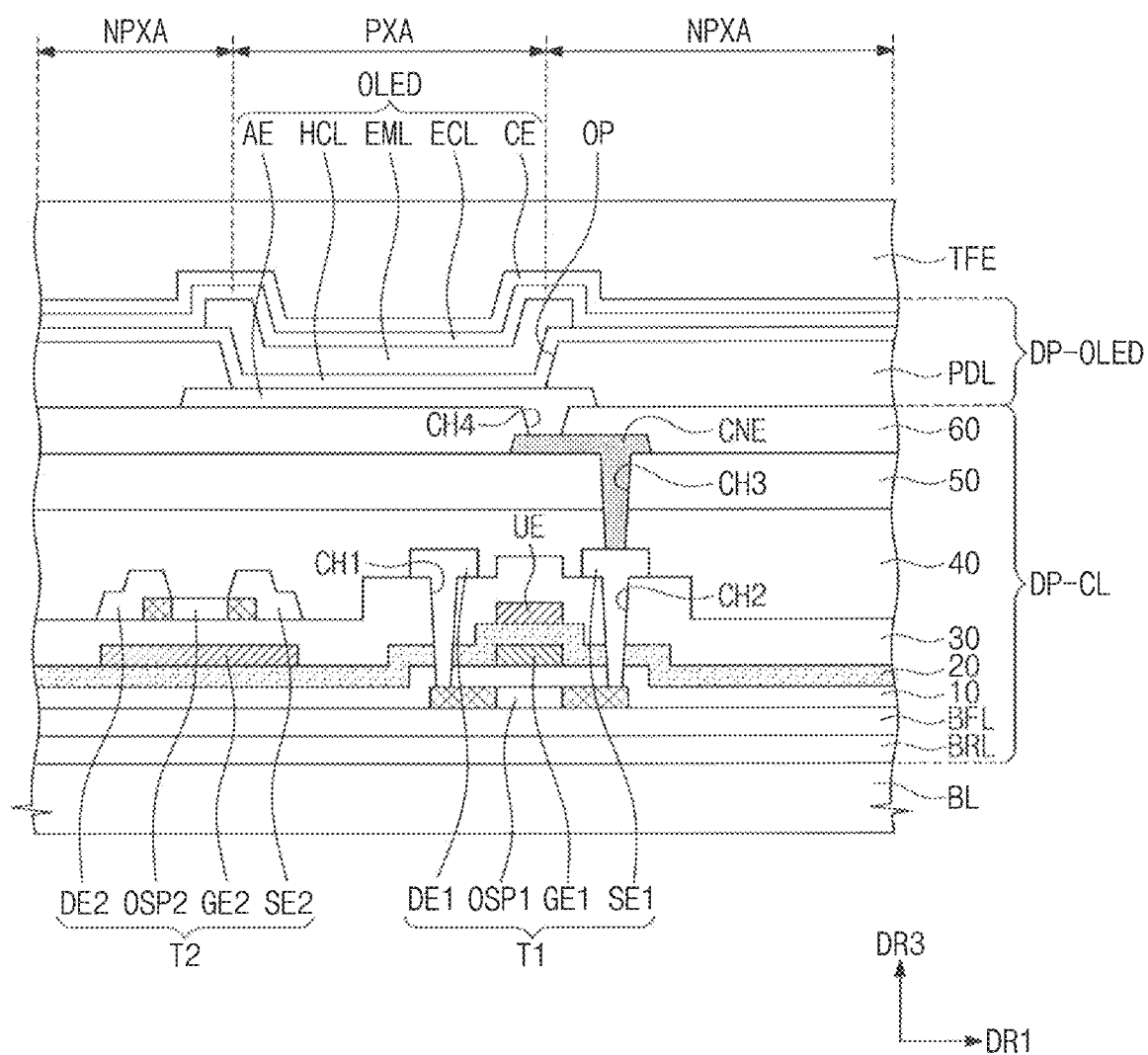
FIGS. 3B and 3C are cross-sectional views of a portion of a pixel according to an exemplary embodiment of the present invention.
Figure 3C:
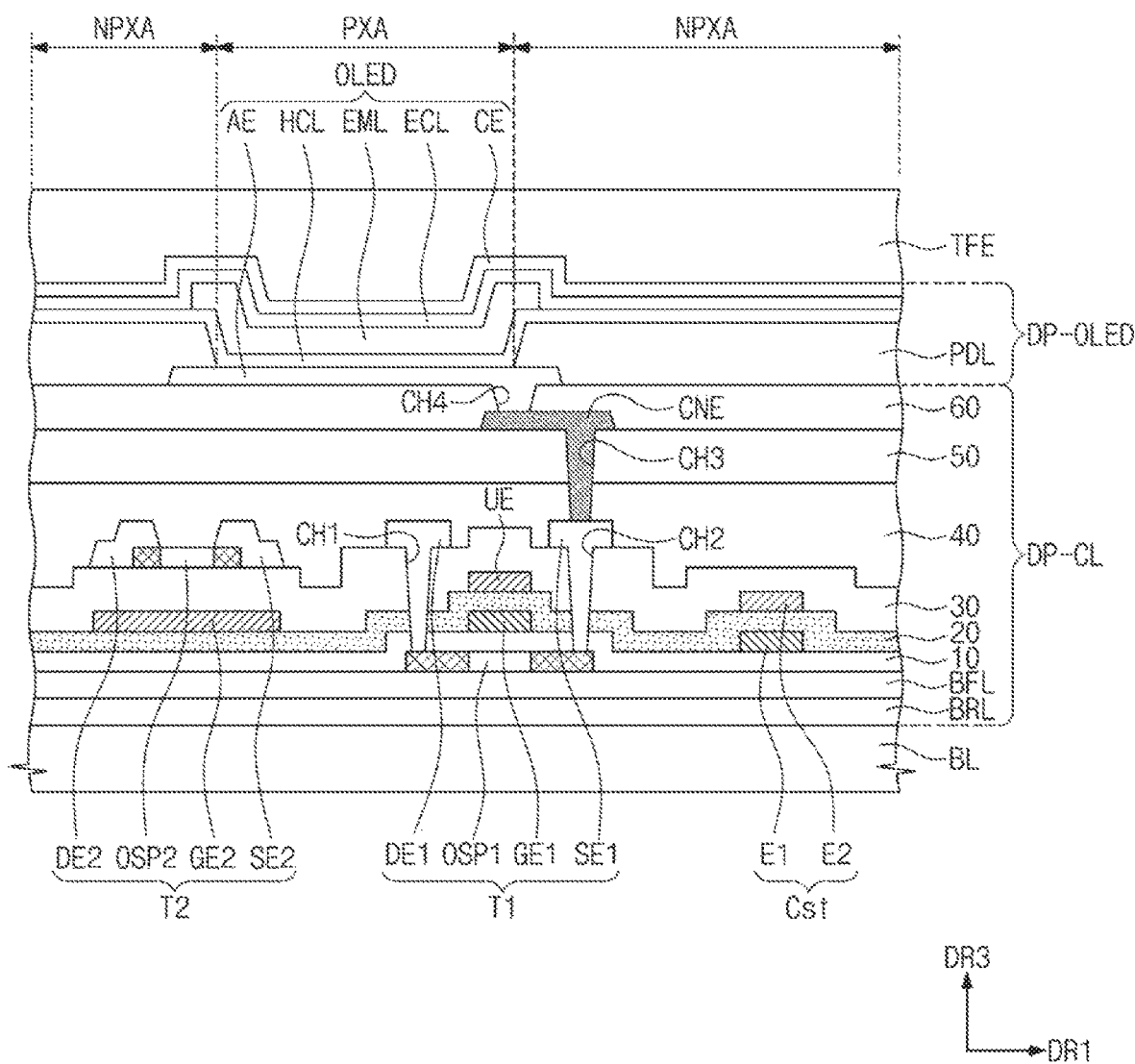
Figure 4A:
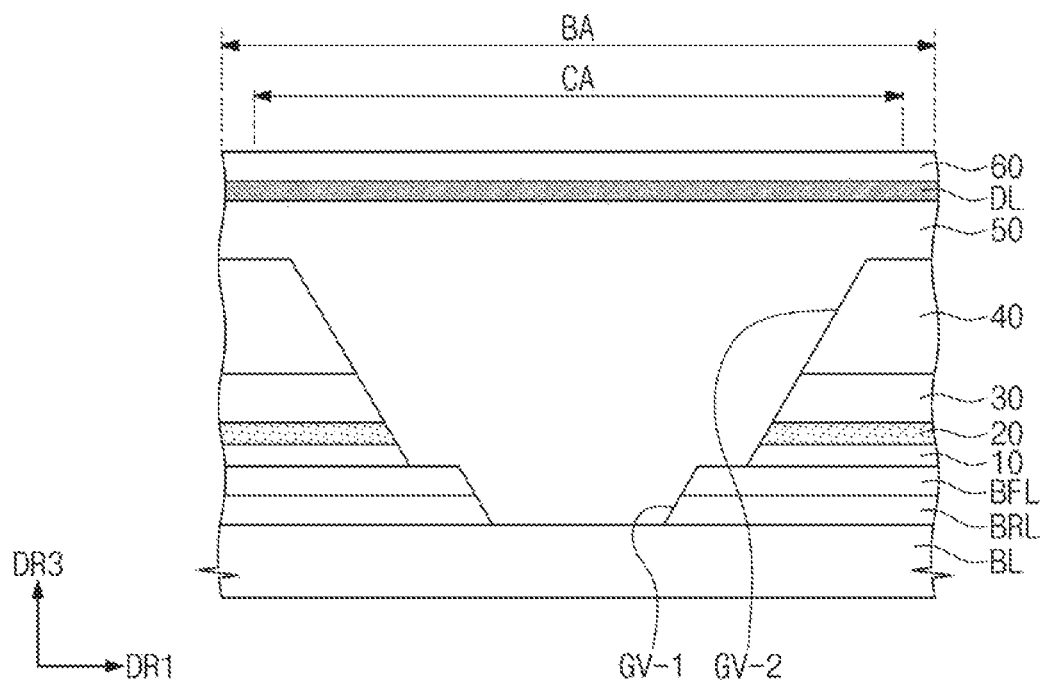
FIGS. 4A and 4B are cross-sectional views of a bending area of a display panel according to an exemplary embodiment of the present invention.
Figure 4B:
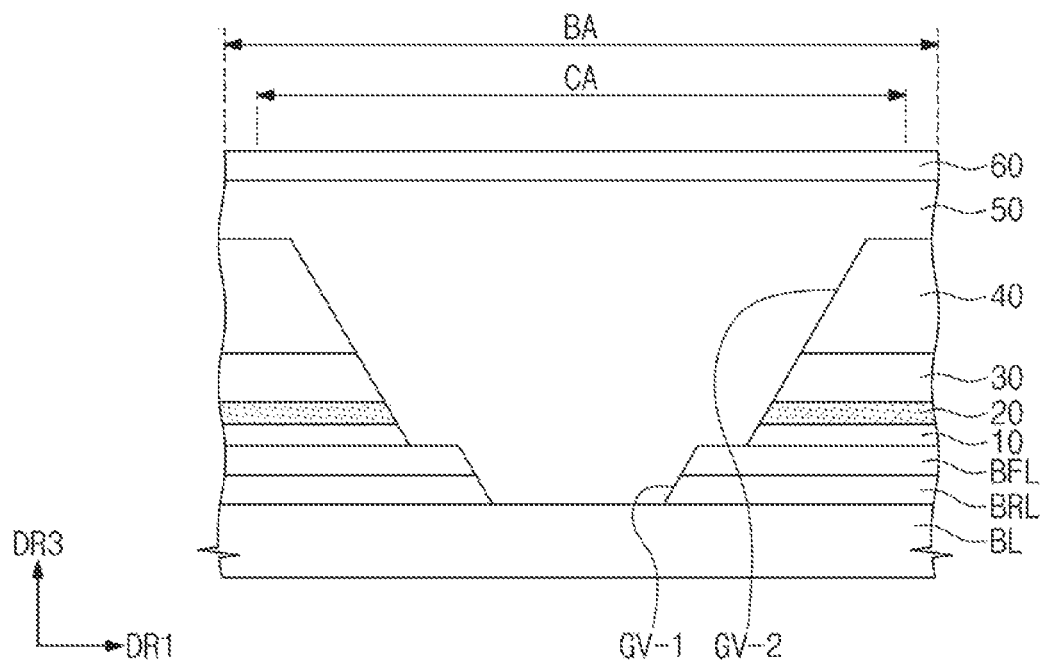

FIG. 3A is an equivalent circuit diagram of a pixel according to an exemplary embodiment of the present invention. FIGS. 3B and 3C are cross-sectional views of a portion of a pixel PX according to an exemplary embodiment of the present invention. FIGS. 4A and 4B are cross-sectional views of a bending area of a display panel according to an exemplary embodiment of the present invention.

Referring to FIG. 3A, any one scan line GL, any one data line DL, and a power line PL may be connected to a pixel PX. Although the pixel PX according to an exemplary embodiment of the present invention may be a light emitting type pixel, exemplary embodiments of the present invention are not limited thereto. For example, the pixel PX may include, as a light emitting element, an organic light emitting diode or a quantum dot light emitting diode. A light emitting layer of the organic light emitting diode may include an organic light emitting material. A light emitting layer of the quantum dot light emitting diode may include a quantum dot and a quantum rod. Below, as an example, the pixel PX will be described as an organic light emitting pixel.

The pixel PX may include an organic light emitting diode OLED and a pixel driving circuit for driving the organic light emitting diode OLED. The light emitting diode OLED may be referred to as a light emitting element herein. The organic light emitting diode OLED may be a front light emitting type diode or a rear light emitting type diode. In an exemplary embodiment of the present invention, the pixel driving circuit may include a first thin-film transistor T1 (e.g., a driving transistor), a second thin-film transistor T2 (e.g., a switching transistor), and a capacitor Cst. A first power voltage ELVDD may be provided to the first thin-film transistor T1, and a second power voltage ELVSS may be provided to the organic light emitting diode OLED. The second power voltage ELVSS may be less than the first power voltage ELVDD.

The first thin-film transistor T1 may be connected to the organic light emitting diode OLED. The first thin-film transistor T1 may control a driving current flowing in the organic light emitting diode OLED in correspondence to an electric charge quantity stored in the capacitor Cst. The second thin-film transistor T2 may output a data signal applied to the data line DL in response to a scan signal applied to the scan line GL. The capacitor Cst may hold a voltage corresponding to the data signal received from the second thin-film transistor T2.

Exemplary embodiments of the present invention are not limited to the configuration of the pixel PX described with reference to FIG. 3A. The configuration of the pixel PX may be varied, as desired. For example, the pixel circuit controlling the organic light emitting diode OLED may include, e.g., six or seven thin-film transistors. The organic light emitting diode OLED may be connected between the power line PL and the second thin-film transistor T2.

FIG. 3B, which is a partial configuration of the pixel PX, illustrates a cross-section corresponding to the first thin-film transistor T1, the second thin-film transistor T2, and the organic light emitting diode OLED. The first thin-film transistor T1 may have a top-gate structure. The second thin-film transistor T2 may have a bottom-gate structure. Referring to FIG. 3B, the display panel DP may include a base layer BL, a circuit element layer DP-CL disposed on the base layer BL, a display element layer DP-OLED, and a thin-film encapsulation layer TFE. The display panel DP may include functional layers such as a reflection protective layer and a refractive index adjusting layer. The circuit element layer DP-CL may include a plurality of insulation layers and a circuit element. As an example, the insulation layers may include an organic layer and/or an inorganic layer.

The circuit element layer DP-CL may include a signal line SGL and a driving circuit GDC of a pixel. The circuit element layer DP-CL may be formed through a process of forming an insulation layer, a semiconductor layer, and a conductive layer through coating and deposition and a process of patterning the insulation layer, the semiconductor layer, and the conductive layer through a photolithography process.

The display element layer DP-OLED may include a light emitting element. The display element layer DIP-OLED may further include an organic layer such as a pixel defining layer PDL.

The base layer BL may include a synthetic resin film. The synthetic resin layer may include a thermosetting resin. For example, although the synthetic resin layer may include a polyimide-based resin layer, exemplary embodiments of the present invention are not limited thereto. The synthetic resin layer may include at least one of an acryl-based resin, a methacryl-based resin, a polyisoprene-based resin, a vinyl-based resin, an epoxy-based resin, a urethane-based resin, a cellulose-based resin, a siloxane-based resin, a polyamide-based resin, or a perylene-based resin. The base layer BL may include a glass substrate, a metal substrate, and/or, an organic/inorganic composite substrate.

The areas of the display panel DP described with reference to FIGS. 1A, 1B and 2 may be defined in the base layer BL in substantially the same manner as described above for the display panel DP. For example, the base layer BL may include a first area NBA and a second area BA that is bent from the first area NBA.

According to an exemplary embodiment of the present invention, the second area BA may extend from the first area NBA. The second area BA may include the curvature area CA. The second area BA may have a smaller thickness (e.g., in the third direction DR3) than that of the first area NBA. Thus, bending or curving of the curvature area CA in the second area BA may be achieved with a relatively small amount of force applied to the second area BA, and a stress applied to a connection between the first area NBA and the second area BA may be relatively low. The curvature area CA may be permanently maintained in a curved state, or may remain bendable.

At least one inorganic layer may be disposed on a top surface of the base layer BL. The inorganic layer may include at least one of an aluminum oxide, a titanium oxide, a silicon oxide, a silicon oxynitride, a zirconium oxide, or hafnium oxide. The inorganic layer may have a single layer or a multiple layer structure. The multi-layer inorganic layers may include a barrier layer BRL and/or a buffer layer BFL, which will be described in more detail below. The barrier layer BRL and the buffer layer BFL may be selectively disposed, as desired. Thus, either of the barrier layer BRL or the buffer layer BFL may be individually referred to as an inorganic layer. Alternatively, the barrier layer BRL and the buffer layer BFL may collectively be referred to as an inorganic layer.

The barrier layer BRL may prevent foreign substances from being introduced from the outside. The barrier layer BRL may include a silicon oxide layer and/or a silicon nitride layer. The silicon oxide layer and the silicon nitride layer may be provided in a plurality of layers. The silicon oxide layers and the silicon nitride layers may be alternately and repeatedly stacked.

The buffer layer BFL may be disposed on the barrier layer BRL. The buffer layer BFL may increase a coupling force between the base layer BL and conductive patterns or semiconductor patterns. The buffer layer BFL may include a silicon oxide layer and/or a silicon nitride layer. The silicon oxide layer and the silicon nitride layer may be alternately and repeatedly stacked.

A first semiconductor pattern OSP1 may be disposed on the buffer layer BFL. The first semiconductor pattern OSP1 may include a silicon semiconductor. Thus, the first semiconductor pattern OSP1 may be referred to as a silicon semiconductor pattern. The first semiconductor pattern OSP1 may include a polysilicon semiconductor. However, exemplary embodiments of the present invention are not limited thereto. For example, the first semiconductor pattern OSP1 may include amorphous silicon. The first semiconductor pattern OSP1 may include an input area (e.g., a first portion), an output area (e.g., a second portion), and a channel area (e.g., a third portion) defined between the input area and the output area. The channel area of the first semiconductor pattern OSP1 may be defined in correspondence to a first control electrode GE1 that will be described in more detail below. For example, the first control electrode GE1 and the first semiconductor pattern OSP1 may at least partially overlap each other (e.g., may be fully aligned with each other) along the third direction DR3. Each of the input area and the output area may have a conductivity relatively higher than that of the channel area because the input area and the output area are doped with a dopant. The input area and the output area may be doped with an n-type dopant. In an exemplary embodiment of the present invention, although the n-type first thin-film transistor T1 is exemplarily described, the first thin-film transistor T1 may be a p-type transistor.

A first insulation layer 10 may be disposed on the buffer layer BFL. The first insulation layer 10 may overlap each of the plurality of pixels PX (e.g., along the third direction DR3, which may be orthogonal to the upper surface of the base layer BL; see, e.g., FIG. 1A). The first insulation layer 10 may substantially cover upper and sides surfaces of the first semiconductor pattern OSP1. The upper surface of the first semiconductor pattern OSP1 may face away from the base layer BL in the third direction DR3 and the side surfaces of the first semiconductor pattern OSP1 may face along the first direction DR1 perpendicular to the third direction DR3. Upper and side surfaces of other layers described in more detail below may refer to surfaces facing away from the base layer BL in the third direction DR3 and side surfaces thereof may refer to surfaces facing each other in the first direction DR1. The first insulation layer 10 may include an inorganic layer and/or an organic layer and may have a single-layer or multi-layer structure.

In an exemplary embodiment of the present invention, the first insulation layer 10 may include the inorganic layer and may include at least one of an aluminum oxide, a titanium oxide, a silicon oxide, a silicon oxynitride, a zirconium oxide, or hafnium oxide. In an exemplary embodiment of the present invention, the first insulation layer 10 may be a single-layer including silicon oxide.

A first control electrode GE1 may be disposed on the first insulation layer 10. The first control electrode GE1 may overlap the channel area of the first semiconductor pattern OSP1 (e.g., along the third direction DR3, which may be orthogonal to the upper surface of the base layer BL).

A second insulation layer 20 may substantially cover upper and side surfaces of the first control electrode GE1 disposed on the first insulation layer 10. The second insulation layer 20 may overlap each of the plurality of pixels PX (e.g., along the third direction DR3, which may be orthogonal to the upper surface of the base layer BL; see, e.g., FIG. 1). The second insulation layer 20 may include an inorganic layer and/or an organic layer and may have a single-layer or multi-layer structure.

In an exemplary embodiment of the present invention, the second insulation layer 20 may include the inorganic layer and may include at least one of an aluminum oxide, a titanium oxide, a silicon oxide, a silicon oxynitride, a zirconium oxide, or hafnium oxide. In an exemplary embodiment of the present invention, the second insulation layer 20 may be a single-layer including silicon oxide.

A second control electrode GE2 may be disposed on the second insulation layer 20. The second control electrode GE2 might not overlap the first control electrode GE1. Thus, the second control electrode GE2 may be spaced apart from the first control electrode GE1 (e.g., along the first direction DR1). In an exemplary embodiment of the present invention, an upper electrode UE may be disposed on the second insulation layer 20. The upper electrode UE may overlap the first control electrode GE1 (e.g., along the third direction DR3, which may be orthogonal to the upper surface of the base layer BL). Since the second control electrode GE2 and the upper electrode UE may be formed through the same process as each other, the second control electrode GE2 and the upper electrode UE may include a same material as each other and may have the same lamination structure as each other. In an exemplary embodiment of the present invention, the upper electrode UE may be omitted.

A third insulation layer 30 substantially covering upper and side surfaces of the second control electrode GE2 and the upper electrode UE may be disposed on the second insulation layer 20. The third insulation layer 30 may include an inorganic layer and/or an organic layer and may have a single-layer or multi-layer structure.

In an exemplary embodiment of the present invention, the third insulation layer 30 may include the inorganic layer and may include at least one of an aluminum oxide, a titanium oxide, a silicon oxide, a silicon oxynitride, a zirconium oxide, or hafnium oxide. In an exemplary embodiment of the present invention, the third insulation layer 30 may be a single-layer include silicon oxide.

A second semiconductor pattern OSP2 overlapping the second control electrode GE2 (e.g., along the third direction DR3, which may be orthogonal to the upper surface of the base layer BL) may be disposed on the third insulation layer 30. The second semiconductor pattern OSP2 may include an oxide semiconductor. Thus, the second semiconductor pattern OSP2 may be referred to as an oxide semiconductor pattern. The second semiconductor pattern OSP2 may include a crystalline or non-crystalline oxide semiconductor. For example, the oxide semiconductor may include a metal oxide such as zinc (Zn), indium (In), gallium (Ga), tin (Sn) or titanium (Ti), metal such as zinc (Zn), indium In), gallium (Ga), tin (Sn), or titanium (Ti), or a mixture thereof. The oxide semiconductor may include an indium-tin oxide (ITO), an indium-gallium-zinc oxide (IGZO), a zinc oxide (ZnO), an indium-zinc oxide (IZnO), a zinc-indium oxide (ZIO), an indium oxide (InO), a titanium oxide (TiO), an indium-zinc-tin oxide (IZTO), or a zinc-tin oxide (ZTO).

The second semiconductor pattern OSP2 may include an input area (e.g., a first portion), an output area (e.g., a second portion), and a channel area (e.g., a third portion) defined between the input area and the output area. Each of the input area and the output area may include impurities. The channel area of the second semiconductor pattern OSP2 may be defined as an area exposed from a second input electrode DE2 and a second output electrode SE2, which will be described in more detail below.

The impurities of the second semiconductor pattern OSP2 may be reduced metal materials. Each of the input area and the output area of the second semiconductor pattern OSP2 may include metal materials reduced from a metal oxide included in the channel area. Thus, the second thin-film transistor T2 may reduce a leakage current and may serve as a switching element having an on-off characteristic with increased accuracy and reliability.

A first input electrode DE1, a first output electrode SE1, a second input electrode DE2, and a second output electrode SE2 may be disposed on the third insulation layer 30. Since the first input electrode DE1, the first output electrode SE1, the second input electrode DE2, and the second output electrode SE2 may be formed through the same process as each other, each of the first input electrode DE1, the first output electrode SE1, the second input electrode DE2, and the second output electrode SE2 may include a same material as each other and may have the same lamination structure as each other.

The first input electrode DE1 and the first output electrode SE1 may be respectively connected to the first semiconductor pattern OSP1 through a first contact hole CH1 and a second contact hole CH2 exposing the input area and the output area of the first semiconductor pattern OSP1, respectively. The first contact hole CH1 and the second contact hole CH2 may pass through the first insulation layer 10, the second insulation layer 20 and the third insulation layer 30.

The second input electrode DE2 and the second output electrode SE2 may respectively be connected to opposite ends of the second semiconductor pattern OSP2, respectively. At least a portion of the second input electrode DE2 may be directly disposed on the input area of the second semiconductor pattern OSP2, and at least a portion of the second output electrode SE2 may be directly disposed on the output area of the second semiconductor pattern OSP2.

The fourth insulation layer 40 substantially covering upper and sides surfaces of the first input electrode DE1, the first output electrode SE1, the second input electrode DE2, and the second output electrode SE2 may be disposed on the third insulation layer 30. The fourth insulation layer 40 may include an inorganic layer and/or an organic layer and may have a single-layer or multi-layer structure.

In an exemplary embodiment of the present invention, the fourth insulation layer 40 including the inorganic layer and may include at least one of an aluminum oxide, a titanium oxide, a silicon oxide, a silicon oxynitride, a zirconium oxide, or hafnium oxide. The fourth insulation layer 40 may include a silicon oxide layer.

The fifth insulation layer 50 may be disposed on the fourth insulation layer 40. The fifth insulation layer 50 may include an organic layer. A connection electrode CNE may be disposed on the fifth insulation layer 50. The connection electrode CNE may be connected to the first output electrode SE1 through a third contact hole CH3 passing through the fourth insulation layer 40 and the fifth insulation layer 50. The sixth insulation layer 60 substantially covering upper and side surfaces of the connection electrode CNE may be disposed on the fifth insulation layer 50. The sixth insulation layer 60 may be referred to as a passivation layer. The sixth insulation layer 60 may include an organic layer and may have a single-layer or multi-layer structure.

In an exemplary embodiment of the present invention, each of the fifth insulation layer 50 and the sixth insulation layer 60 may have a single-layer structure including a polyimide-based resin layer. However, exemplary embodiments of the present invention are not limited thereto. For example, each of the fifth insulation layer 50 and the sixth insulation layer 60 may include at least one of an acryl-based resin, a methacryl-based resin, a polyisoprene-based resin, a vinyl-based resin, an epoxy-based resin, a urethane-based resin, a cellulose-based resin, a siloxane-based resin, a polyamide-based resin, or a perylene-based resin The organic light emitting diode OLED may be disposed on the sixth insulation layer 60. An anode AE of the organic light emitting diode OLED may be disposed on the sixth insulation layer 60. The anode AE may be connected to the connection electrode CNE through a fourth contact hole CH4 passing through the sixth insulation layer 60. A pixel defining layer PDL may be disposed on the sixth insulation layer 60.

An opening OP of the pixel defining layer PDL may expose at least a portion of the anode AE. The opening OP of the pixel defining layer PDL may define a light emitting area PXA of the pixel. For example, the plurality of pixels PX (see, e.g., FIG. 1A) may be arranged under a predetermined rule on a plane of the display panel DP (see, e.g., FIG. 1A). For example, the plurality of pixels PX may be arranged in a matrix configuration having rows and columns extending along the first and second directions DR1 and DR2. An area on which the plurality of pixels PX are disposed may be defined as a pixel area, and one pixel area may include a light emitting area PXA and a non-light emitting area NPXA adjacent to the light emitting area PXA. The non-light emitting area NPXA may surround the light emitting area PXA (e.g., when viewed in a plan view along the third direction DR3, which may be orthogonal to the upper surface of the base layer BL).

The display area DP-DA (see, e.g., FIGS. 1A and 1B) may include a plurality of pixel areas. For example, the display area DP-DA may include a plurality of the light emitting areas PXA and the non-light emitting area NPXA surrounding the plurality of the light emitting areas PXA.

A hole control layer HCL may be disposed on the light emitting area PXA and the non-light emitting area NPXA in common. A common layer such as the hole control layer HCL may connect two or more pixels of the plurality of pixels PX to each other. The hole control layer HCL may include a hole transporting layer and a hole injection layer.

An organic light emitting layer EML may be disposed on the hole control layer HCL. The organic light emitting layer EML may be disposed on only an area corresponding to the opening OP. The organic light emitting layer EML may be separately provided on each of the plurality of pixels PX.

The organic light emitting layer EML may be disposed on two or more pixels of the plurality of pixels PXn. The organic light emitting layer EML may generate white light. The organic light emitting layer EML may have a multi-layer structure.

An electron control layer ECL may be disposed on the organic light emitting layer EML. The electron control layer ECL may include an electron transporting layer and an electron injection layer. A cathode CE may be disposed on the electron control layer ECL. The electron control layer ELC and the cathode CE may be disposed on the plurality of pixels PX in common.

The thin-film encapsulation layer TFE may be disposed on the cathode CE. The thin-film encapsulation layer TFE may be disposed on two or more pixels of the plurality of pixels PX. According to an exemplary embodiment of the present invention, the thin-film encapsulation layer TFE may substantially cover an upper surface of the cathode CE. In an exemplary embodiment of the present invention, a capping layer may also substantially cover the upper surface of the cathode CE. The capping layer may include an organic layer. In an exemplary embodiment of the present invention, an inorganic layer may be formed on the capping layer through a sputtering method. In an exemplary embodiment of the present invention, the lamination structure of the organic light emitting diode OLED may have a structure that is upside down from the structure described with reference to FIG. 3B.

The thin-film encapsulation layer TFE may include at least an inorganic layer or an organic layer. In an exemplary embodiment of the present invention, the thin-film encapsulation layer TFE may include two inorganic layers with an organic layer disposed therebetween. In an exemplary embodiment of the present invention, the thin-film encapsulation layer TFE may include a plurality of inorganic layers and a plurality of organic layers, which are alternately and repeatedly stacked.

The inorganic layer of the thin-film encapsulation layer TFE protects the organic light emitting diode OLED from moisture/oxygen, and the organic layer of the thin-film encapsulation layer TFE protects the organic light emitting diode OLED from foreign substances such as dust particles. Although the inorganic layer of the thin-film encapsulation layer TFE may include a silicon nitride layer, a silicon oxynitride layer, a silicon oxide layer, a titanium oxide layer, or an aluminum oxide layer, exemplary embodiments of the present invention are not limited thereto. Although the organic layer of the thin-film encapsulation layer TFE may include an acryl-based organic layer, exemplary embodiments of the present invention are not limited thereto.

According to an exemplary embodiment of the present invention, the first thin-film transistor T1 may include a silicon semiconductor, for example, a polysilicon semiconductor, and thus the first thin-film transistor T1 may have a relatively high electron mobility. The first thin-film transistor T1 may have an increased voltage-current accuracy and reliability. The second thin-film transistor T2 may include an oxide semiconductor, and thus an occurrence of a leakage current may be reduced. Thus, the driving voltage of the pixel PX (see, e.g., FIG. 3A) may be reduced, and an occurrence of a malfunction thereof may be reduced or prevented.

As the input electrode DE1 and the output electrode SE1 of the first thin-film transistor T1, which are disposed on the same layer as that of the input electrode DE2 and the output electrode SE2 of the second thin-film transistor T2, may be respectively directly connected to the first semiconductor pattern OSP1 through the first and second contact holes CH1 and CH2 passing through the first to third insulation layers 10 to 30, misalignment may decrease. When the input electrode DE1 and the output electrode SE1 are disposed on the same layer as that of the upper electrode UE (e.g., in a display panel according to a comparative example), a process of forming connection electrodes CNE on the same layer as that of the input electrode DE2 and the output electrode SE2 of the second thin-film transistor T2 may be performed. The connection electrodes CNE may be connected to the input electrode DE1 and the output electrode SE1, which are disposed on the same layer as that of the upper electrode UE. Thus, while the connection electrodes CNE are formed, the misalignment may occur. Since the input electrode DE2 and the output electrode SE2 of the second thin-film transistor T2 and the input electrode DE1 and the output electrode SE1 of the first thin-film transistor T1 are formed through separated processes, the number of masks used in the manufacturing process may increase.

Referring to FIG. 3C, the display panel according to an exemplary embodiment of the present invention may further include the capacitor Cst formed through the same process as that of the components of the first thin-film transistor T1.

A first electrode E1 of the capacitor Cst may be disposed on the first insulation layer 10. The first electrode E1 may be formed through the same process as that of the first control electrode GE1. The first electrode E1 may be connected to the first control electrode GE1.

The second insulation layer 20 may substantially cover upper and side surfaces of the first electrode E1. A second electrode E2 of the capacitor Cst may be disposed on the second insulation layer 20. In an exemplary embodiment of the present invention, the upper electrode UE may be electrically connected to the second electrode E2. The upper electrode UE and the second electrode E2 may be formed through the same process as each other, and thus the upper electrode UE and the second electrode E2 may include a same material as each other and may include a same structure (e.g., a single or multilayered structure) as each other. The third insulation layer 30 substantially covering the second electrode E2 and the upper electrode UE may be disposed on the second insulation layer 20.

FIGS. 4A and 4B are views illustrating a cross-section in the first direction DR1 of the curvature area CA in FIG. 2. FIG. 4A illustrates a cross-section overlapping the signal line DL, and FIG. 4B illustrates a cross-section of an area on which the signal line is not disposed. In FIG. 4A, the data line DL illustrated as the signal line DL.

Referring to FIGS. 4A and 4B, the second area BA may have a lamination structure that is similar to that of the first area NBA (see, e.g., FIGS. 1A, 1B and 2), for example, the display area DP-DA (see, e.g., FIGS. 1A, 1B and 2), in a cross-section. The barrier layer BRL, the buffer layer BFL, and the first to sixth insulation layers 10 to 60 may be sequentially arranged from the top surface of the base layer BL (e.g., along the third direction DR3, which may be orthogonal to the upper surface of the base layer BL).

An opening GV-1 (e.g., which may be referred to herein as a lower opening) overlapping the second area BA (e.g., along the third direction DR3, which may be orthogonal to the upper surface of the base layer BL) may define the barrier layer BRL and/or the buffer layer BFL. The lower opening GV-1 may be defined in the curvature area CA. Referring to FIGS. 1A, 1B and 2, the inorganic layers BRL and BFL disposed below the first semiconductor pattern OSP1 may overlap the display area DP-DA (e.g., along the third direction DR3, which may be orthogonal to the upper surface of the base layer BL) and may extend to the second area BA. The lower opening GV-1 may be formed by removing portions of the inorganic layers BRL and BFL so that at least a portion of the inorganic layers BRL and BFL overlaps the second area BA (e.g., along the third direction DR3, which may be orthogonal to the upper surface of the base layer BL). The base layer BL exposed by the lower opening GV-1 may have a width in the first direction DR1, which is less than that of the curvature area CA in the first direction DR1.

An opening GV-2 (e.g., which may be referred to herein as an upper opening) overlapping the second area BA (e.g., along the third direction DR3, which may be orthogonal to the upper surface of the base layer BL) may be defined in the first to fourth insulation layers 10 to 40. The upper opening GV-2 may be defined in the curvature area CA. A top surface of an uppermost inorganic layer of the inorganic layers included in the barrier layer BRL and the buffer layer BFL may be exposed from the first to fourth insulation layers 10 to 40.

Each of side surfaces, which define the lower opening GV-1, of the barrier layer BRL and the buffer layer BFL may have a predetermined slope in a cross-section. Each of side surfaces, which define the upper opening GV-2, of the first to fourth insulation layers 10 to 40 may have a predetermined slope in a cross-section.

In an exemplary embodiment of the present invention, a width of the upper opening GV-2 in the first direction DR1, which corresponds to the fourth insulation layer 40, may be greater than that of the curvature area CA in the first direction DR1.

The fifth insulation layer 50 including an organic layer may be disposed in the upper opening GV-2 and the lower opening GV-1. Thus, the fifth insulation layer 50 may be referred to as an organic layer. The fifth insulation layer 50 may be in direct contact with a top surface of the base layer BL, an inclined surface of the lower opening GV-1, and an inclined surface of the upper opening GV-2. The fifth insulation layer 50 may be in direct contact with a portion of the top surface of the buffer layer BFL, which may be exposed from the first to fourth insulation layers 10 to 40.

As the openings GV-1 and GV-2 are defined in the inorganic layers BRL, BFL, and insulation layers 10 to 40 of the curvature area CA, and the organic layer 50 is disposed in the openings GV-1 and GV-2, the bending area BA may have increased flexibility. As the organic layer 50 is disposed on the bending area BA and the non-bending area NBA, the display panel DP may have a simplified structure. Thus, a relatively lower number of masks may be used in forming the organic layer 50. For example, the organic layer 50 may be formed by a single continuous process in the bending area BA and the non-bending area NBA. Thus, manufacturing costs may be reduced and an occurrence of defects may be reduced.

At least one portion of the signal line DL may be disposed on the fifth insulation layer 50. The sixth insulation layer 60 may substantially cover an upper surface of the signal line DL, which may protect the signal line DL. Another portion of the signal line DL, for example, another portion disposed on the display area DP-DA, may be disposed on a different layer from the sixth insulation layer 60. For example, another portion of the signal line DL may be disposed on the third insulation layer 30. The at least one portion and the another portion of the signal line DL may be connected through the contact hole passing through the fourth insulation layer 40 and the fifth insulation layer 50. The contact hole may be disposed on the non-display area DP-NDA of the first area NBA.

In an exemplary embodiment of the present invention, a layer extending from the layer disposed on the display area DP-DA may be further disposed on a top surface of the sixth insulation layer 60. In an exemplary embodiment of the present invention, the sixth insulation layer 60 might not be disposed in the curvature area CA.

Figure 5D:
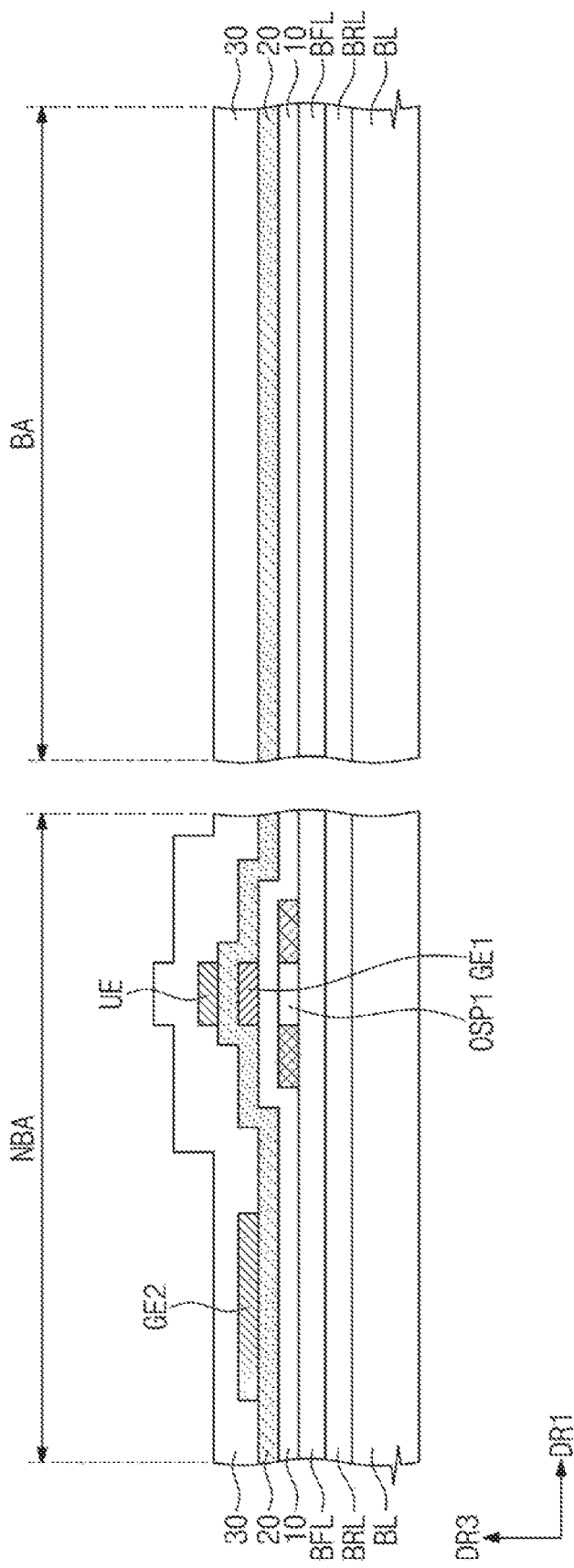

FIGS. 5A, 5B, 5C, 5D, 5E, 5F, 5G, 5H, 5I, 5J, 5K, 5L, 5M, 5N and 5O are cross-sectional views of a process of manufacturing a display panel according to an exemplary embodiment of the present invention t. Each of FIGS. 5A to 5O comparatively illustrates areas corresponding to those described above with reference to FIGS. 3B and 4A. Thus, duplicative descriptions of components that are the same or substantially the same as those described above with reference to FIGS. 1A, 1B, 2, 3A, 3B, 3C, 4A and 4B may be omitted below.

Referring to FIG. 5A, at least one inorganic layer may be formed on the first area NBA and the second area BA of the base layer BL. The base layer BL may be disposed on a working substrate during the manufacturing process. The working substrate may be removed after the display panel is manufactured.

The inorganic layers may be formed by depositing, coating, or printing an inorganic material. The barrier layer BRL may be formed by sequentially forming a silicon oxide layer and a silicon nitride layer. The buffer layer BFL may be formed by sequentially forming a silicon oxide layer and a silicon nitride layer on the barrier layer BRL.

A first preliminary semiconductor pattern OSP1-P may be formed on the inorganic layer. The first preliminary semiconductor pattern OSP1-P may include a silicon semiconductor material. The semiconductor layer may be formed and then patterned to form the first preliminary semiconductor pattern OSP1-P. The semiconductor layer may be crystallized. For example, the semiconductor layer may be crystallized either before or after patterning the semiconductor layer to form the first preliminary semiconductor pattern OSP1-P. A doping process may be performed on the first preliminary semiconductor pattern OSP1-P.

Referring to FIG. 5B, the first insulation layer 10 may be formed on the first area NBA and the second area BA of the inorganic layer. The first insulation layer 10 may be formed through deposition, coating, or printing. Insulation layers disposed on the first insulation layer 10 may be also formed through deposition, coating, or printing.

The first control electrode GE1 may be formed on the first insulation layer 10. The first control electrode GE1 may be formed by forming a conductive layer on the first insulation layer 10 and then pattering the same. The first electrode E1 (see. e.g., FIG. 3C) of the capacitor Cst may be formed through the same process as that of the first control electrode GE1.

The first preliminary semiconductor pattern OSP1-P may be doped by using the first control electrode GE1 as a mask. An area (e.g., which may be referred to herein as a channel area) overlapping the first control electrode GE1 (e.g., along the third direction DR3, which may be orthogonal to the upper surface of the base layer BL) might not be doped, and opposite side areas (e.g., an input area and an output area) of the channel area may be doped. In an exemplary embodiment of the present invention, the doping may be performed by using an n-type dopant, e.g., pentad. Thus, the first semiconductor pattern OSP1 may be formed.

Referring to FIG. 5C, the second insulation layer 20 may be formed on the first area NBA and the second area BA of the first insulation layer 10 to substantially cover the first control electrode GE1. The second control electrode GE2 non-overlapping the first control electrode GE1 (e.g., along the third direction DR3, which may be orthogonal to the upper surface of the base layer BL) may be formed on the second insulation layer 20. The upper electrode UE may be formed in the same process as that of the second control electrode GE2. The second electrode E2 (see, e.g., FIG. 3C) of the capacitor Cst may be formed through the same process as that of the upper electrode UE.

Referring to FIG. 5D, the third insulation layer 30 substantially covering the second control electrode GE2 and the upper electrode UE may be formed on the first area NBA and the second area BA of the second insulation layer 20.

Figure 5E:
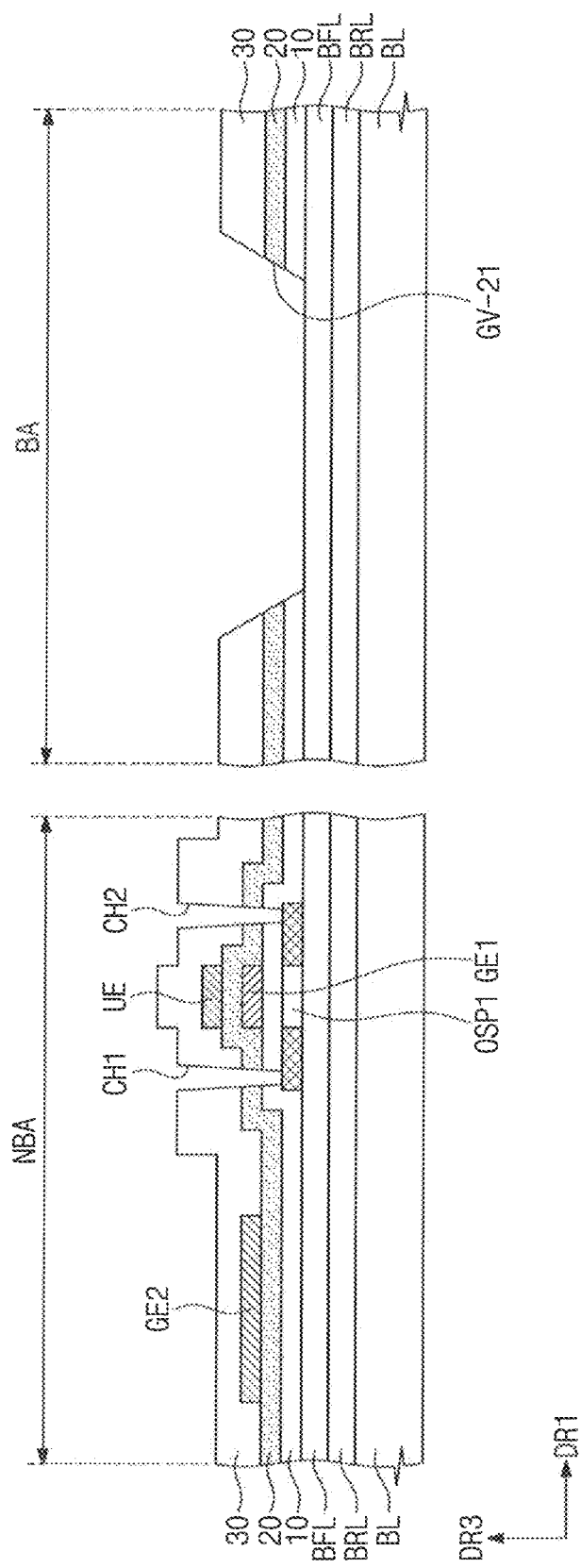

Referring to FIG. 5E, a portion of the insulation layers 10 to 30 may be removed (e.g., which may be referred to herein as a first etching process). The contact holes CH1 and CH2 respectively exposing the input area and the output area of the first semiconductor pattern OSP1 may be defined. In the same process, a first upper opening GV-21 may be formed by partially removing the second area BA of the first to third insulation layers 10 to 30. As a process of forming the contact hole of the first area NBA and a process of forming the opening of the second area BA are performed in a single process, the number of masks used in the manufacturing process may be reduced.

Referring to FIG. 5F, a second preliminary semiconductor pattern OSP2-P may be formed on the third insulation layer 30. The second preliminary semiconductor pattern OSP2-P may include a metal oxide semiconductor material. The second preliminary semiconductor pattern OSP2-P may be formed from the metal oxide semiconductor layer through a photolithography process.

According to an exemplary embodiment of the present invention, a sequence of performing a process described with reference to FIG. 5E and a process described with reference to FIG. 5F may be reversed. In an exemplary embodiment of the present invention, after the second preliminary semiconductor pattern OSP2-P is formed, the contact holes CH1 and CH2 and the first upper opening GV-21 may be defined.

Figure 5G:
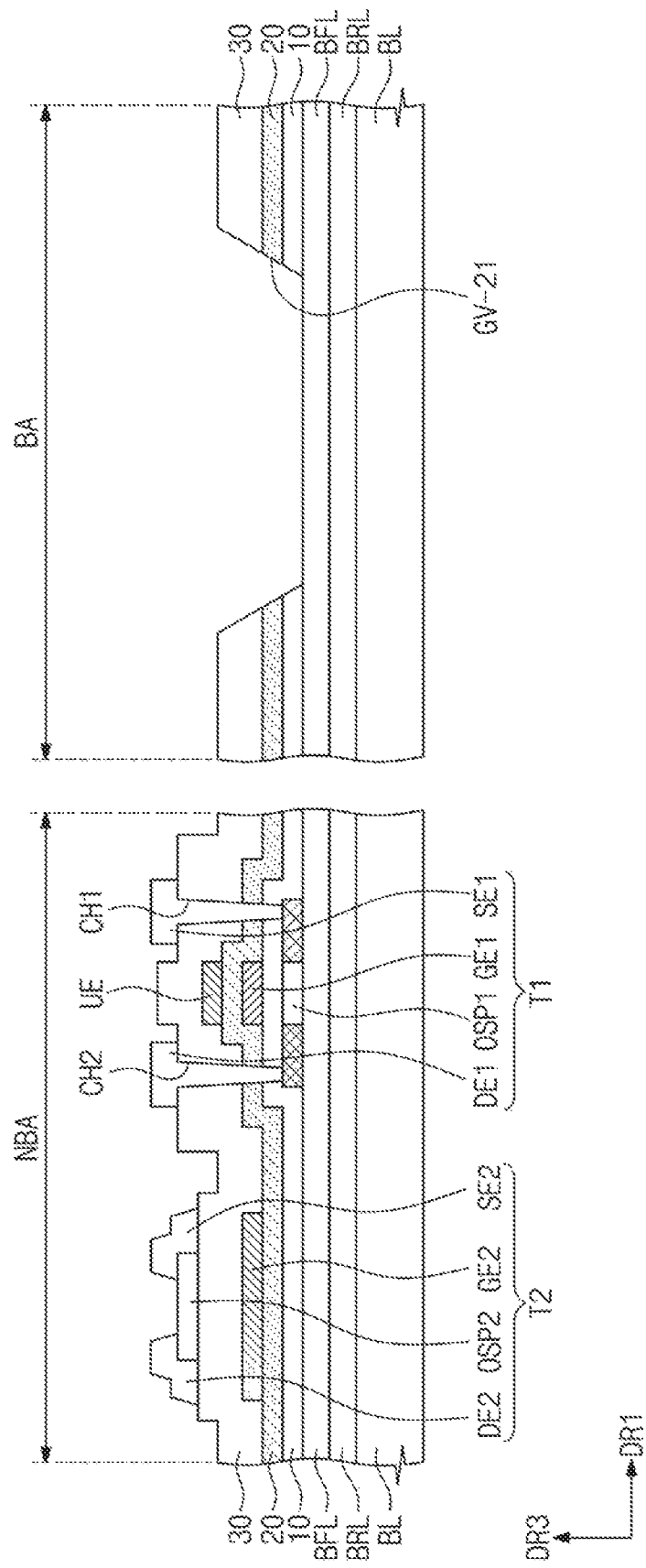

Referring to FIG. 5G, the electrodes DE1, SE1, SE2, and DE2 may be formed on the third insulation layer 30 (e.g., which may be referred to herein as an electrode forming process). After the conductive layer is formed through a deposition process, the electrodes DE1, SE1, SE2, and DE2 may be formed through a patterning process.

The process of patterning the conductive layer may be performed by an etching gas including plasma. The etching gas may include plasma containing oxygen. The etching gas may decrease a hydrogen concentration of an area of the second preliminary semiconductor pattern OSP2-P, which is exposed from the second input electrode DE2 and the second output electrode SE2. Thus, the area of the second preliminary semiconductor pattern OSP2-P, which is exposed from the second input electrode DE2 and the second output electrode SE2, may be changed into the channel area having a semiconductor feature while having a resistance greater than that of the areas of the second preliminary semiconductor pattern OSP2-P, which are covered by the second input electrode DE2 and the second output electrode SE2. Thus, the second semiconductor pattern OSP2 including the input area and the output area, which are spaced apart from each other with a channel area therebetween may be formed from the second preliminary semiconductor pattern OSP2-P.

Figure 5H:
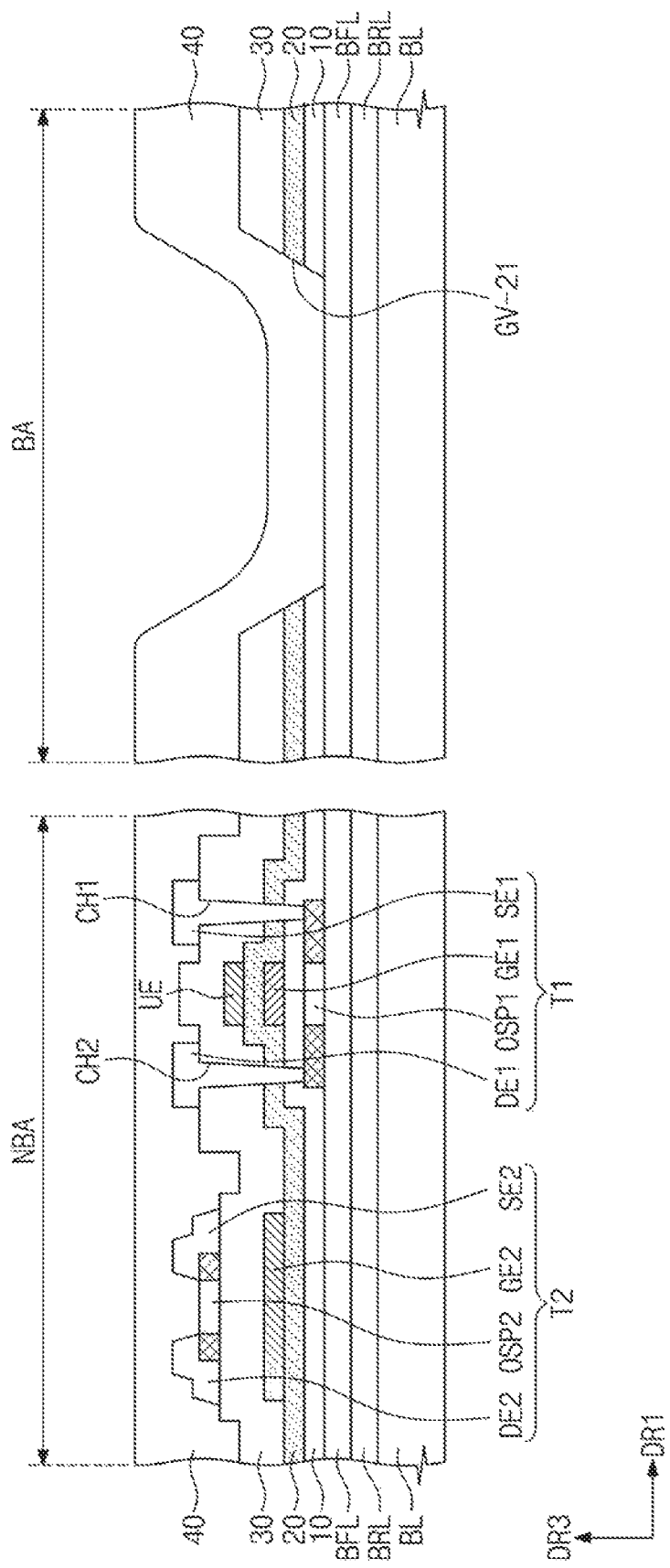

Referring to FIG. 5H, the fourth insulation layer 40 substantially covering the electrodes DE1, SE1, SE2, and DE2 may be formed on the third insulation layer 30. A portion of the fourth insulation layer 40 may be disposed in the first upper opening GV-21.

Figure 5I:
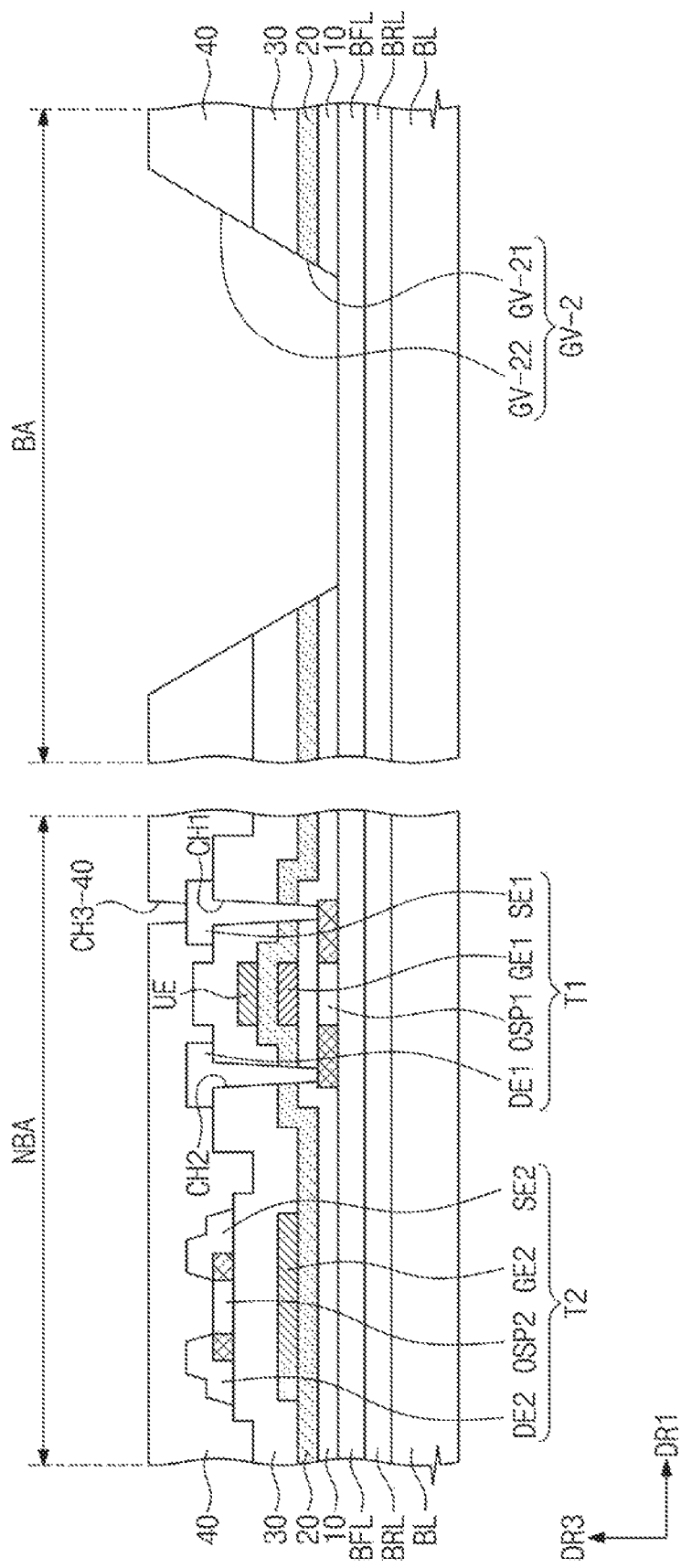

Referring to FIG. 5I, a portion of the fourth insulation layers 40 may be removed (e.g., which may be referred to herein as a second etching process). A contact hole CH3-40 exposing the first output electrode SE1 may be formed. In the same process, a second upper opening GV-22 may be formed by partially removing the second area BA of the fourth insulation layer 40. As a process of forming the contact hole of the first area NBA and a process of forming the opening of the second area BA are performed in a single process, the number of masks used in the manufacturing process may be reduced.

Although an inner surface of the second upper opening GV-22 and an inner surface of the first upper opening GV-21 may be aligned with each other, exemplary embodiments of the present invention are not limited thereto. For example, a top surface of the third insulation layer 30 may be exposed from the fourth insulation layer 40. For example, the inner surface of the second upper opening GV-22 may be spaced apart from the inner surface of the first upper opening GV-21 along the first direction DR1 to expose the top surface of the third insulation layer 30 facing away from the base layer BL.

Figure 5J:
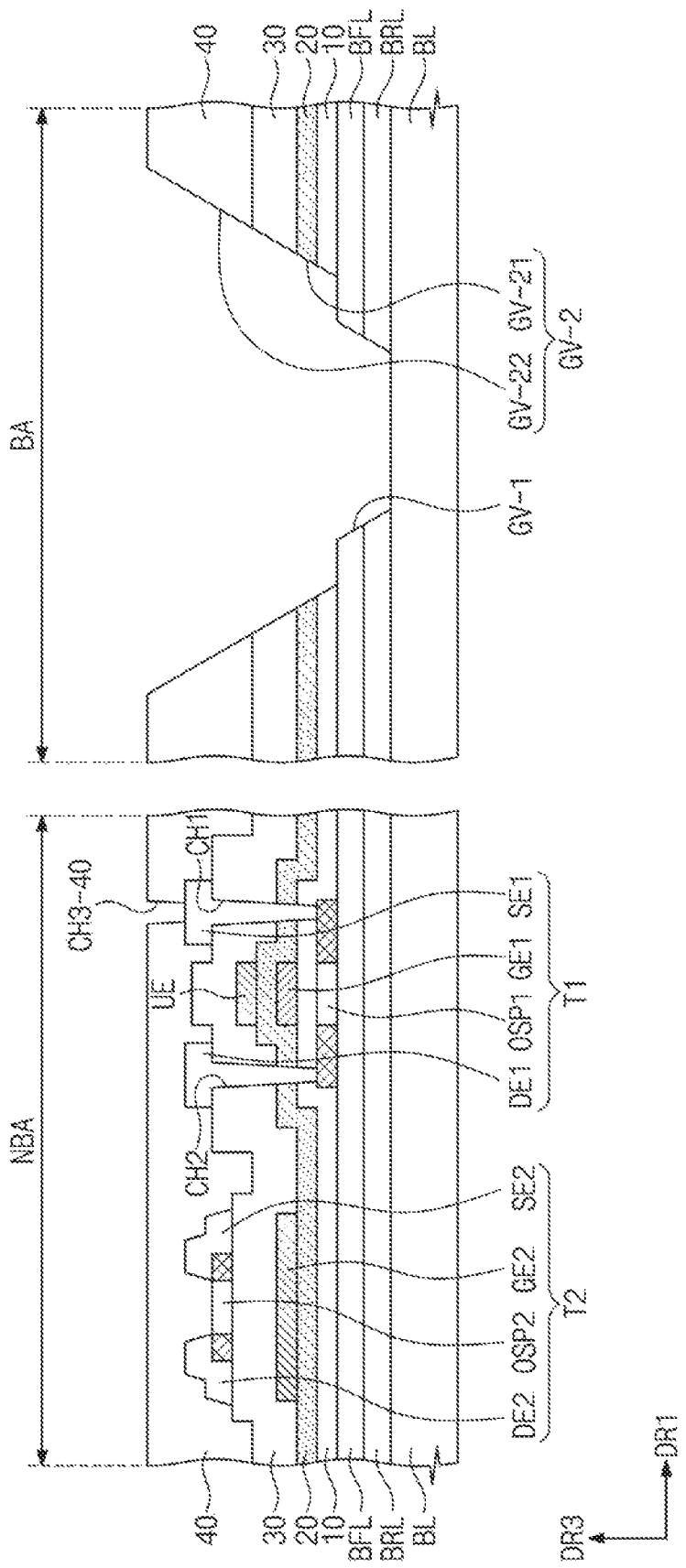

Referring to FIG. 5J, a portion of the inorganic layers BRL and BFL may be removed (e.g., which may be referred to herein as a third etching process). The lower opening GV-1 may be formed by partially removing the second area BA of the barrier layer BRL and the buffer layer BFL by using an etching gas. The top surface of the uppermost inorganic layer of the inorganic layers included in the barrier layer BRL and the buffer layer BFL may be exposed from the first to fourth insulation layers 10 to 40. In an exemplary embodiment of the present invention, an inner surface of the lower opening GV-1 may be aligned with the inner surface of the first upper opening GV-21.

Figure 5K:
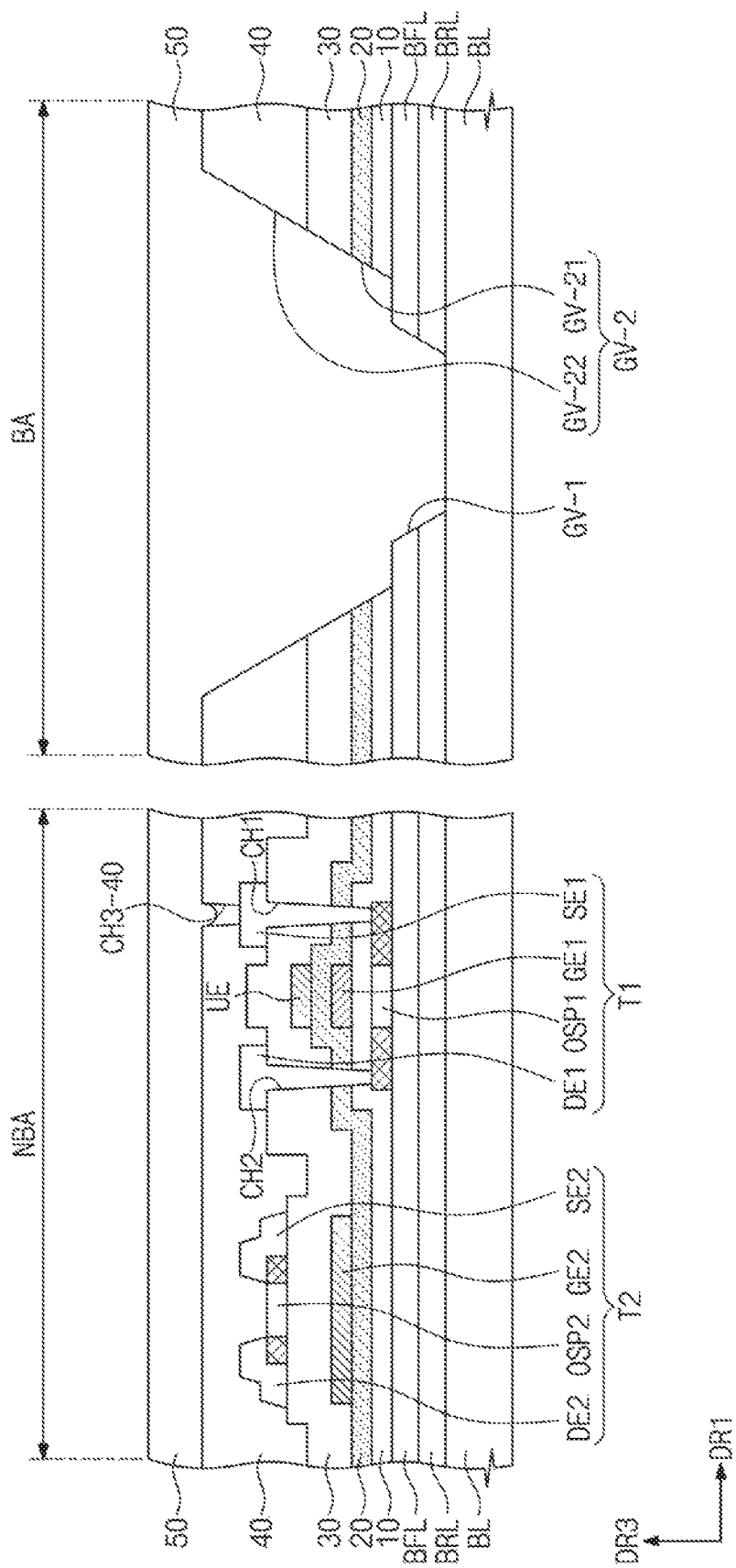

Referring to FIG. 5K, the fifth insulation layer 50 may be formed on the fourth insulation layer 40. The fifth insulation layer 50 may overlap the first area NBA and the second area BA (e.g., along the third direction DR3, which may be orthogonal to the upper surface of the base layer BL). The fifth insulation layer 50 is disposed in the lower opening GV-1 and the upper opening GV-2. The fifth insulation layer 50 may partially fill the contact hole CH3-40.

Referring to FIG. 5L, a portion of the fifth insulation layers 50 may be removed (e.g., which may be referred to herein as a fourth etching process). A contact hole CH-50 may be formed in the fifth insulation layer 50 to expose the first output electrode SE1 substantially covered by the fifth insulation layer 50. A contact hole CH3-50 of the fifth insulation layer 50 may be aligned with the contact hole CH3-40 of the fourth insulation layer 40. Thus, the contact holes CH3-40 and CH3-50 may define a third contact hole CH3.

Referring to FIG. 5M, the connection electrode CNE may be formed on the fifth insulation layer 50. A portion of the signal line DL overlapping the second area BA (e.g., along the third direction DR3, which may be orthogonal to the upper surface of the base layer BL) may be formed through the same process as that of the connection electrode CNE.

Figure 5N:
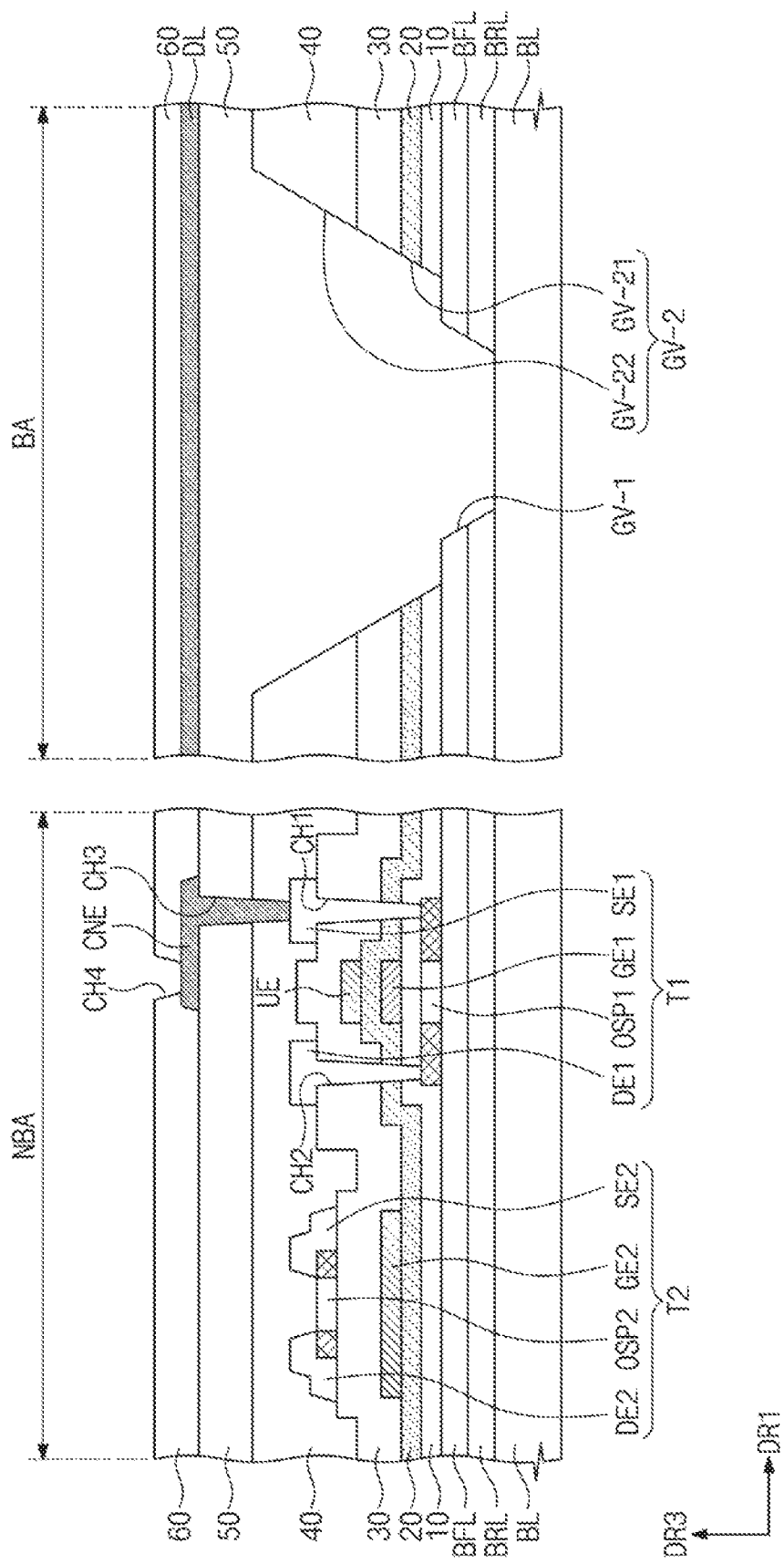
Figure 50:
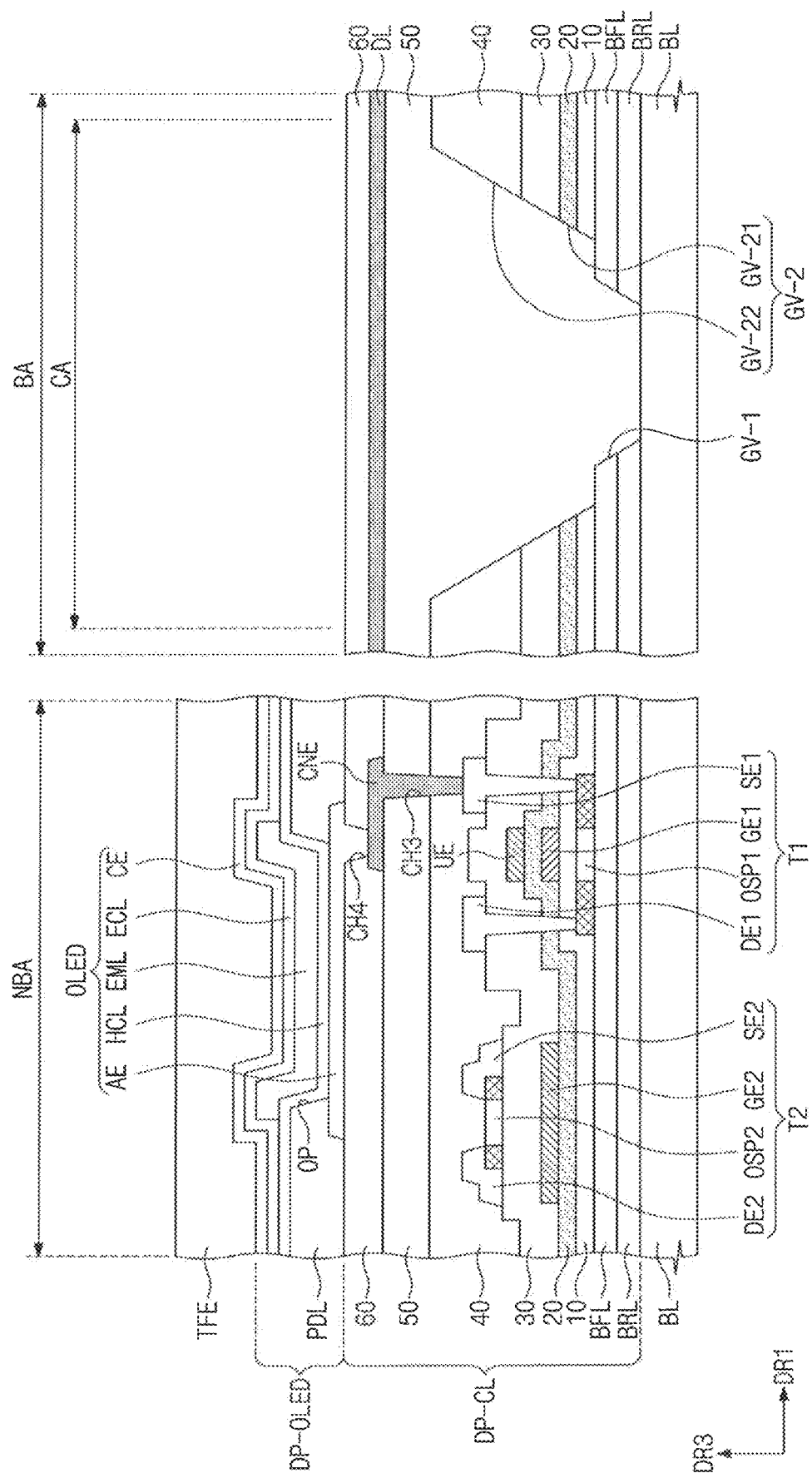

Referring to FIG. 5N, the sixth insulation layer 60 substantially covering the portion overlapping the second area BA of the connection electrode CNE and the signal line DL may be formed on the fifth insulation layer 50. A fourth contact hole CH4 exposing a top surface of the connection electrode CNE may be formed in the sixth insulation layer 60.

Referring to FIG. 5O, the organic light emitting diode OLED may be formed on the sixth insulation layer 60. The anode AE connected to the connection electrode CNE through a fourth contact hole CH4 may be formed on the sixth insulation layer 60. The pixel defining layer PDL exposing a central portion of the anode AE may be formed on the sixth insulation layer 60. After a preliminary pixel defining layer is formed on the sixth insulation layer 60, the opening OP may be formed in the preliminary pixel defining layer.

The hole control layer HCL, the organic light emitting layer EML, the electron control layer ECL, and the cathode CE may be sequentially formed on the first area NBA of the pixel defining layer PDL. The hole control layer HCL, the organic light emitting layer EML, the electron control layer ECL, and the cathode CE may overlap at least the display area DP-DA ((e.g., along the third direction DR3, which may be orthogonal to the upper surface of the base layer BL; see, e.g., FIG. 2).

The thin-film encapsulation layer TFE may be formed on the cathode CE. The organic layer and/or the inorganic layer of the thin-film encapsulation layer TFE may be formed through a deposition or inkjet printing process. Although the thin-film encapsulation layer TFE may be formed on the first area NBA and might not be formed on the second area BA, exemplary embodiments of the present invention are not limited thereto.

Figure 6:
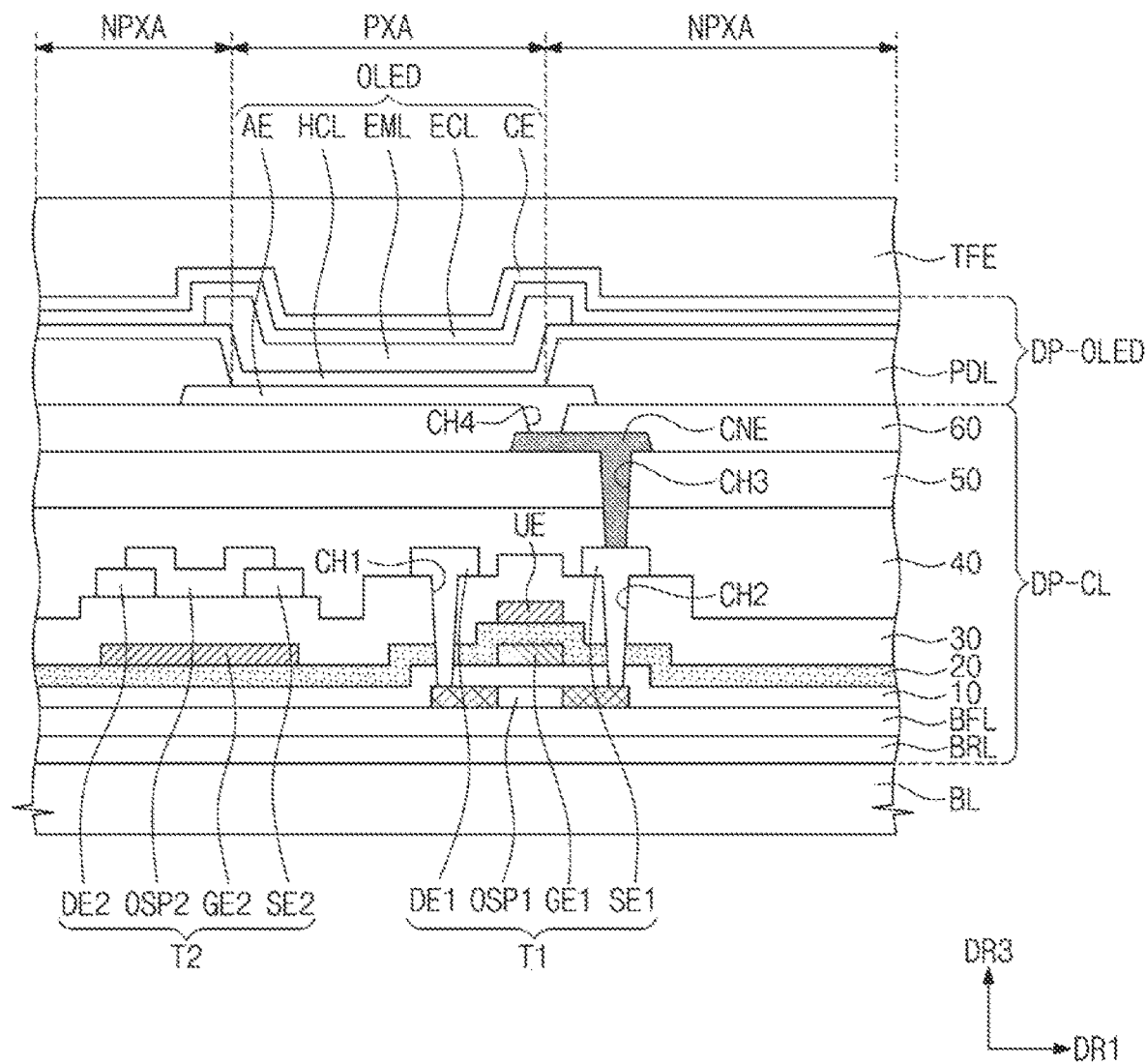
FIG. 6 is a cross-sectional view of a display panel according to an exemplary embodiment of the present invention.
Figure 7:
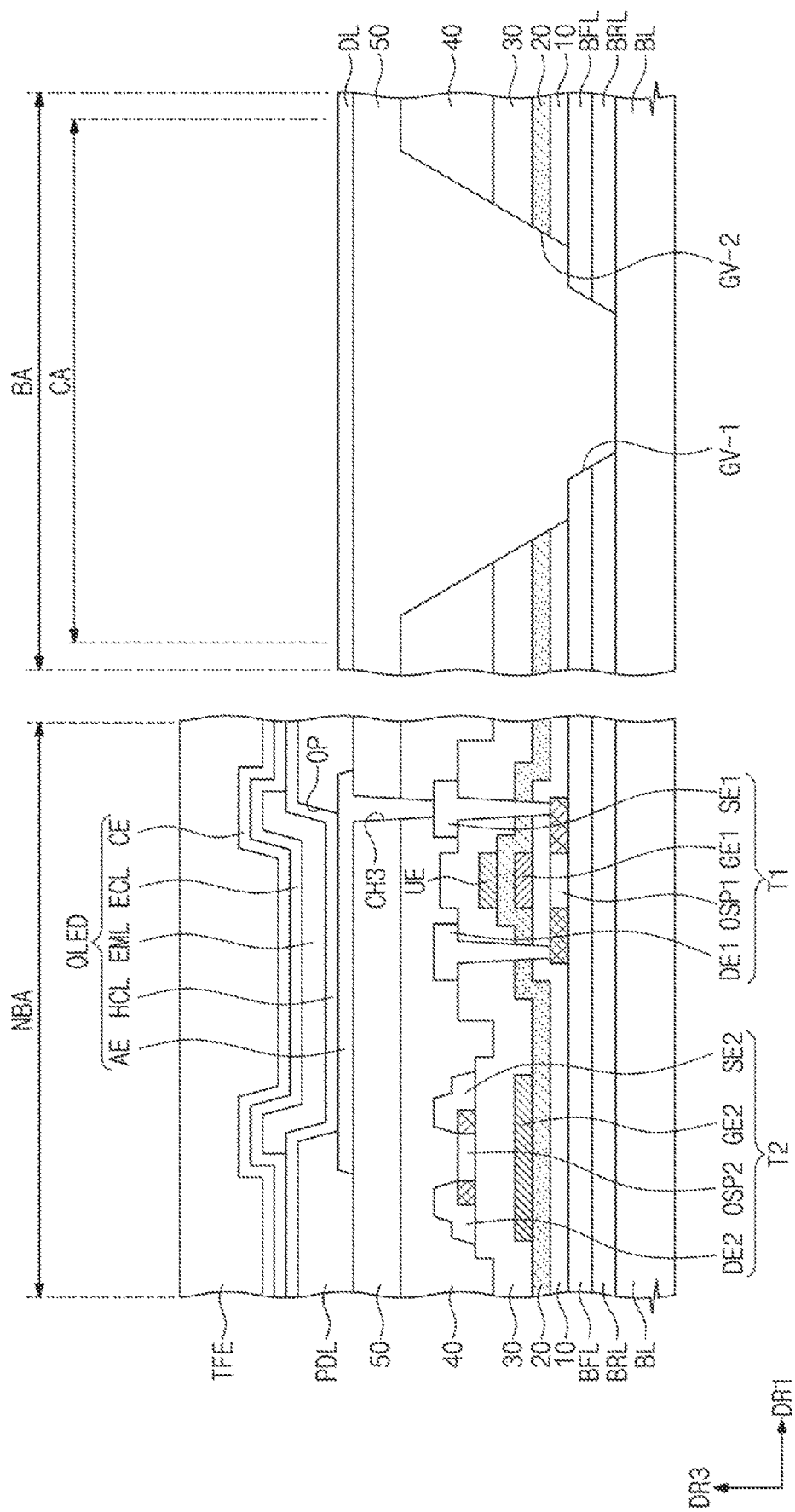
FIG. 7 is a cross-sectional view of a display panel according to an exemplary embodiment of the present invention.

FIG. 6 is a cross-sectional view of a display panel according to an exemplary embodiment of the present invention. FIG. 7 is a cross-sectional view of a display panel according to an exemplary) embodiment of the present invention. FIGS. 8A, 8B, 8C, 8D and 8E are cross-sectional views illustrating a portion of a display panel according to an exemplary embodiment of the present invention. FIG. 9 is a cross-sectional view of a portion of a display panel according to an exemplary embodiment of the present invention.

Duplicative descriptions of components that are the same or substantially the same as those described above with reference to FIGS. 1, 2, 3A, 3B, 3C, 4A, 4B, 5A, 5B, 5C, 5D, 5E, 5F, 5G, 5H, 5I, 5J, 5K, 5L, 5M, 5N and 5O may be omitted below.

Referring to FIG. 6, an arrangement relationship between the second semiconductor pattern OSP2 and both the second input electrode DE2 and the second output electrode SE2 may be varied. As the second semiconductor pattern OSP2 may be formed after the second input electrode DE2 and the second output electrode SE2 are formed, opposite ends of the second semiconductor pattern OSP2 may be directly disposed on the second input electrode DE2 and the second output electrode SE2.

Referring to FIG. 7, the connection electrode CNE and the sixth insulation layer 60 may be omitted. The anode AE may be directly disposed on the fifth insulation layer 50 and connected to the first output electrode SE1 through the third contact hole CH3. The portion of the signal line DL overlapping the second area BA (e.g., along the third direction DR3, which may be orthogonal to the upper surface of the base layer BL) may be directly disposed on the fifth insulation layer 50.

The portion of the data line DL overlapping the second area BA may be formed through the same process as that of the anode AE. Thus, the portion of the data line DL overlapping the second area BA and the anode AE may include a same material and may have a same layer structure as each other.

FIGS. 8A, 8B, 8C, 8D and 8E illustrate display panels DP corresponding to the display panel DP described with reference to FIG. 5O. The display panels DP described with reference to FIGS. 8A to 8E and the display panel DP described with reference to FIG. 5O may be different in a shape of the signal line DL.

Referring to FIGS. 8A to 8E, the signal line (e.g., data lines DL) may include a first portion DL-P1, a second portion DL-P2, and a third portion DL-P3. The first portion DL-P1 may be connected to the pixel PX (see, e.g., FIG. 2), and the third portion DL-P3 may be connected to the corresponding signal pad DP-PD (see, e.g., FIG. 2) or a driving chip. The second portion DL-P2 may connect the first portion DL-P1 to the third portion DL-P3 through the fifth contact hole CH5 and the sixth contact hole CH6. The second portion DL-P2 may overlap the curvature area CA (e.g., along the third direction DR3, which may be orthogonal to the upper surface of the base layer BL).

Referring to FIGS. 8A to 8E, according to an exemplary embodiment of the present invention, the fifth contact hole CH5 may extend to substantially a same depth as the sixth contact hole CH6 along the direction orthogonal to the upper surface of the base layer BL. A bottom surface of the first portion DL-P1 of the signal line facing the base layer BL may be positioned at a first depth above the base layer BL which is substantially the same as a depth of a bottom surface of the third portion DL-P3 of the signal line facing the base layer BL.

Alternatively, according to an exemplary embodiment of the present invention, the bottom surface of the first portion DL-P1 of the signal line facing the base layer BL may be positioned at depth above the base layer BL that is different from a depth of a bottom surface of the third portion DL-P3 of the signal line facing the base layer BL.

Figure 8A:
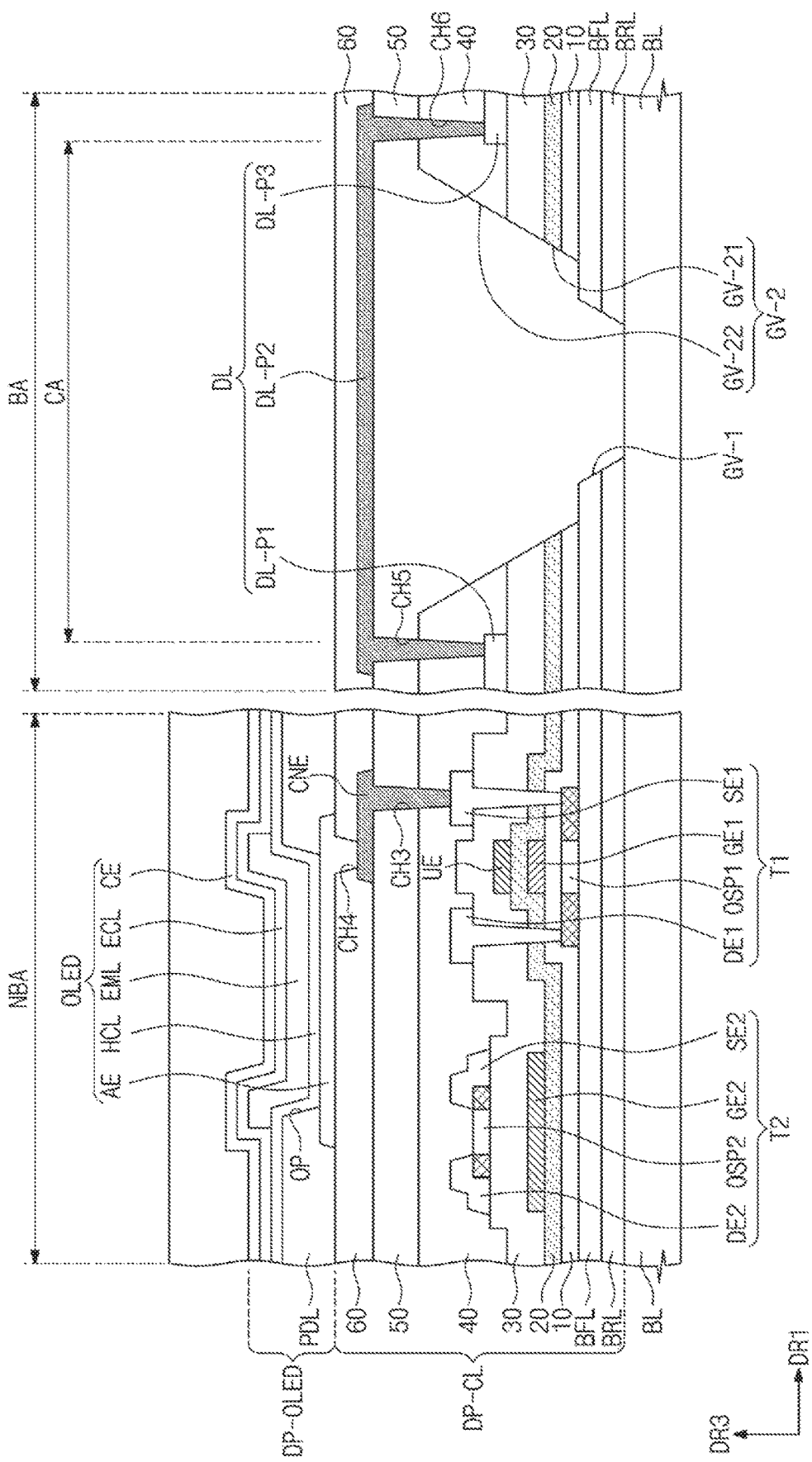
FIGS. 8A, 8B, 8C, 8D and 8E are cross-sectional views illustrating a portion of a display panel according to an exemplary embodiment of the present invention.
Figure 9:
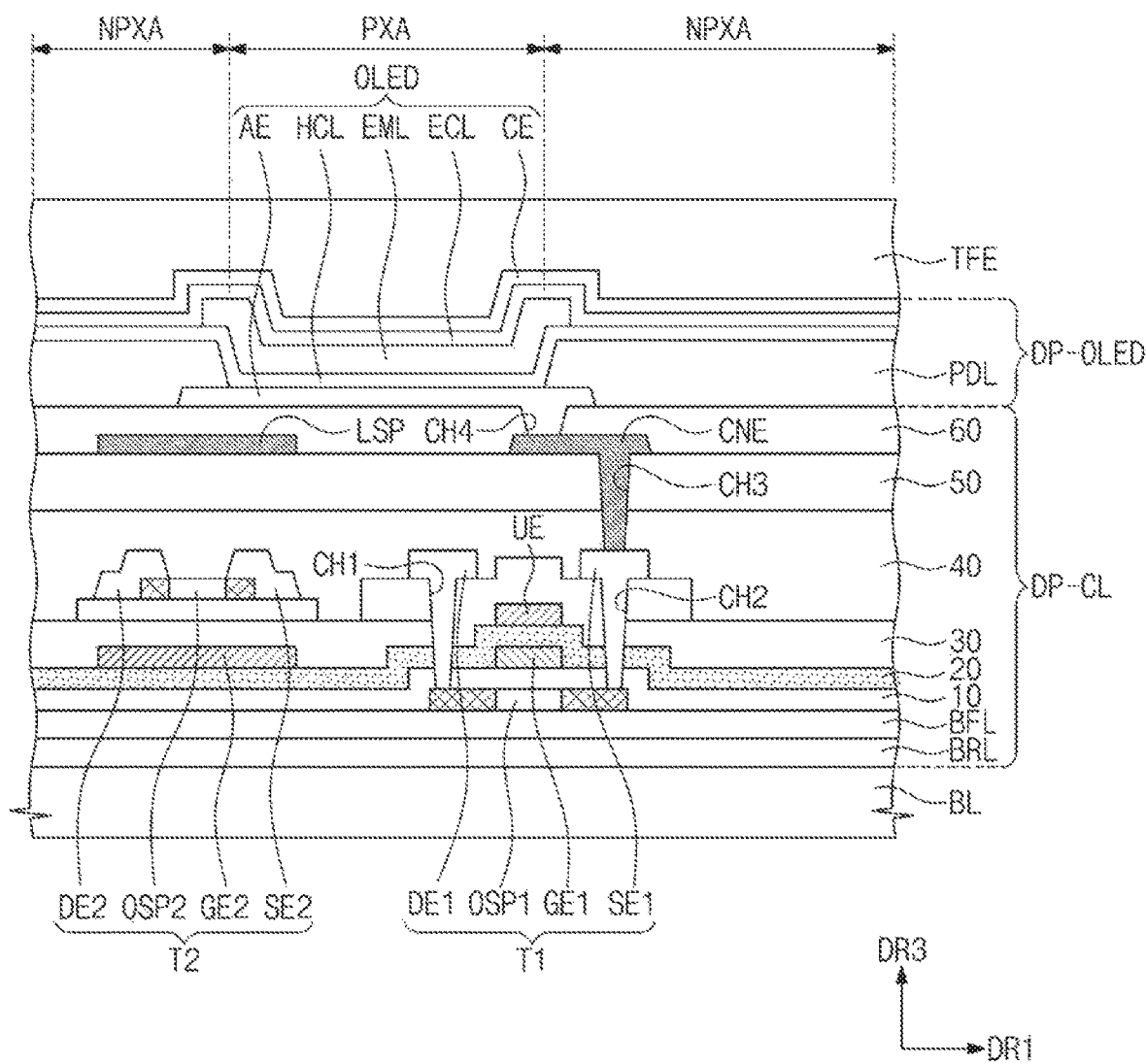
FIG. 9 is a cross-sectional view of a portion of a display panel according to an exemplary embodiment of the present invention.

Referring to FIG. 8A, the first portion DL-P1 and the third portion DL-P3 may be formed through the same process as that of the input electrodes and the output electrodes DE1, SE1, SE2, and DE2 and may be disposed on the same layer as that of the input electrodes and the output electrodes DE1, SE1, SE2, and DE2. Each of the fifth contact hole CH5 and the sixth contact hole CH6 may pass through the fourth insulation layer 40 and the fifth insulation layer 50. Each of the fifth contact hole CH5 and the sixth contact hole CH6 may be formed through the same process as that of the third contact hole CH3.

Figure 8B:
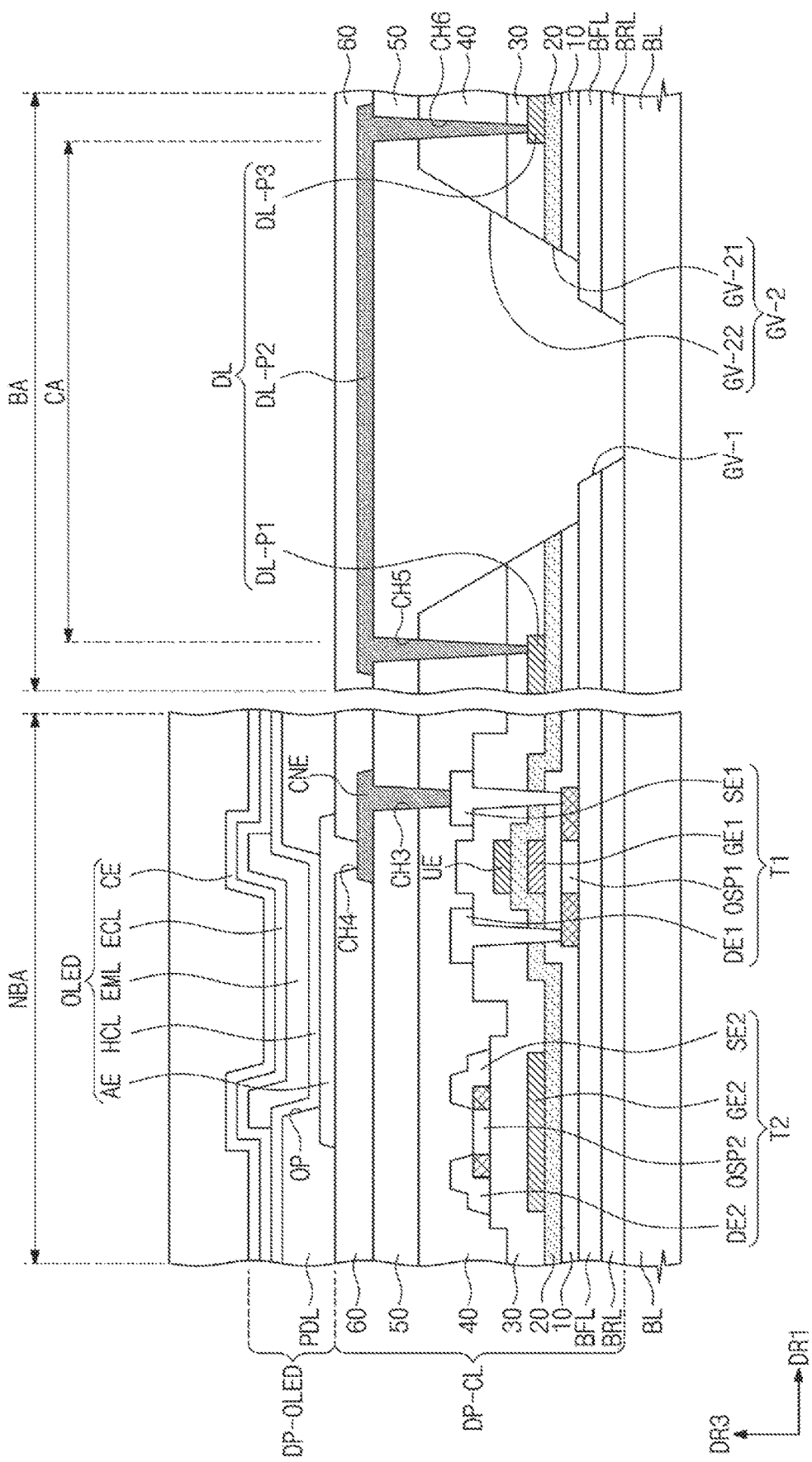

Referring to FIG. 8B, the first portion DL-P1 and the third portion DL-P3 may be formed through the same process as that of the upper electrode UE and may be disposed on the same layer as that of the upper electrode UE. Each of the fifth contact hole CH5 and the sixth contact hole CH6 may pass through the third insulation layer 30, the fourth insulation layer 40, and the fifth insulation layer 50. Each of the fifth contact hole CH5 and the sixth contact hole CH6 may be formed through the same process as that of the third contact hole CH3 and may further pass through the third insulation layer 30. In an exemplary embodiment of the present invention, a photolithography process for forming the fifth contact hole CH5 and the sixth contact hole CH6 may be performed.

Figure 8C:
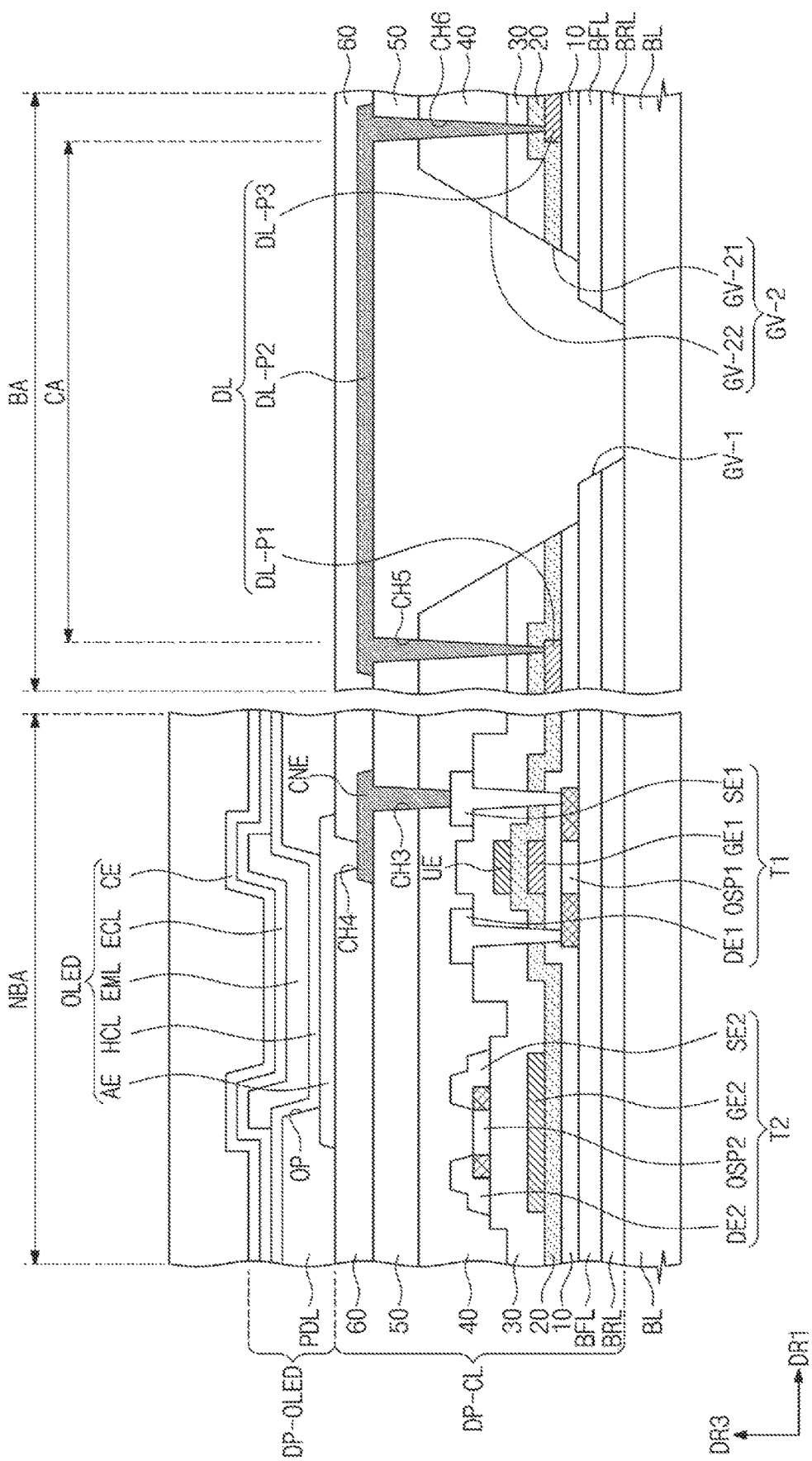

Referring to FIG. 8C, the first portion DL-P1 and the third portion DL-P3 may be formed through the same process as that of the first control electrode GE1 and may be disposed on the same layer as that of the first control electrode GE1. Each of the fifth contact hole CH5 and the sixth contact hole CH6 may pass through the second insulation layer 20, the third insulation layer 30, the fourth insulation layer 40, and the fifth insulation layer 50. Each of the fifth contact hole CH5 and the sixth contact hole CH6 may be formed through the same process as that of the third contact hole CH3 and may further pass through the second and third insulation layers 20 and 30. In an exemplary embodiment of the present invention, the photolithography process for forming the fifth contact hole CH5 and the sixth contact hole CH6 may be performed.

One of the first portion DL-P1 and the third portion DL-P3 may be formed through the same process of that of one of the first input electrode DE1, the upper electrode UE, and the first control electrode GE1 and may be disposed on the same layer as that of the first input electrode DE1, the upper electrode UE, or the first control electrode GE1, and the other of the first portion DL-P1 and the third portion DL-P3 may be formed through the same process of that of one of the first input electrode DE1, the upper electrode UE, and the first control electrode GE1 and disposed on the same layer as that of the first input electrode DE1, the upper electrode UE, or the first control electrode GE1. According to the position of each of the first portion DL-P1 and the third portion DL-P3, the insulation layers through which each of the fifth contact hole CH5 and the sixth contact hole CH6 passes may be changed. Each of the fifth contact hole CH5 and the sixth contact hole CH6 may be formed through the same process as that of the third contact hole CH3. Thus, depths of the fifth contact hole CH5 and the sixth contact hole CH6 may be differently controlled.

Figure 8D:
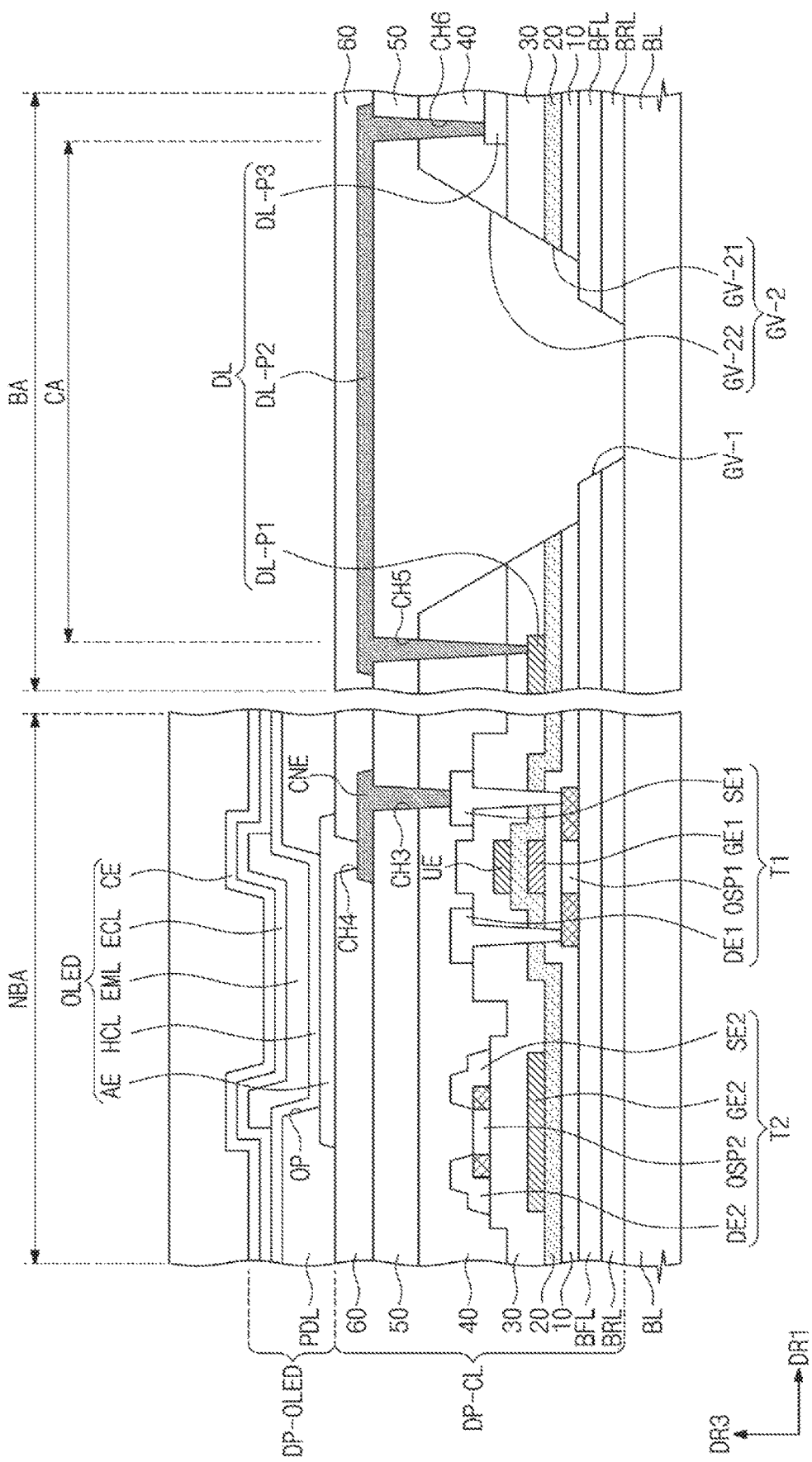

For example, referring to FIG. 8D, the first portion DL-P1 may be formed through the same process as that of the upper electrode LIE and may be disposed on the same layer as that of the upper electrode UE. The third portion DL-P3 may be formed through the same process as that of the first input electrode DE1 and may be disposed on the same layer as that of the s first input electrode DE1. The fifth contact hole CH5 may pass through the third insulation layer 30, the fourth insulation layer 40, and the fifth insulation layer 50, and the sixth contact hole CH6 may pass through the fourth insulation layer 40 and the fifth insulation layer 50.

Figure 8E:
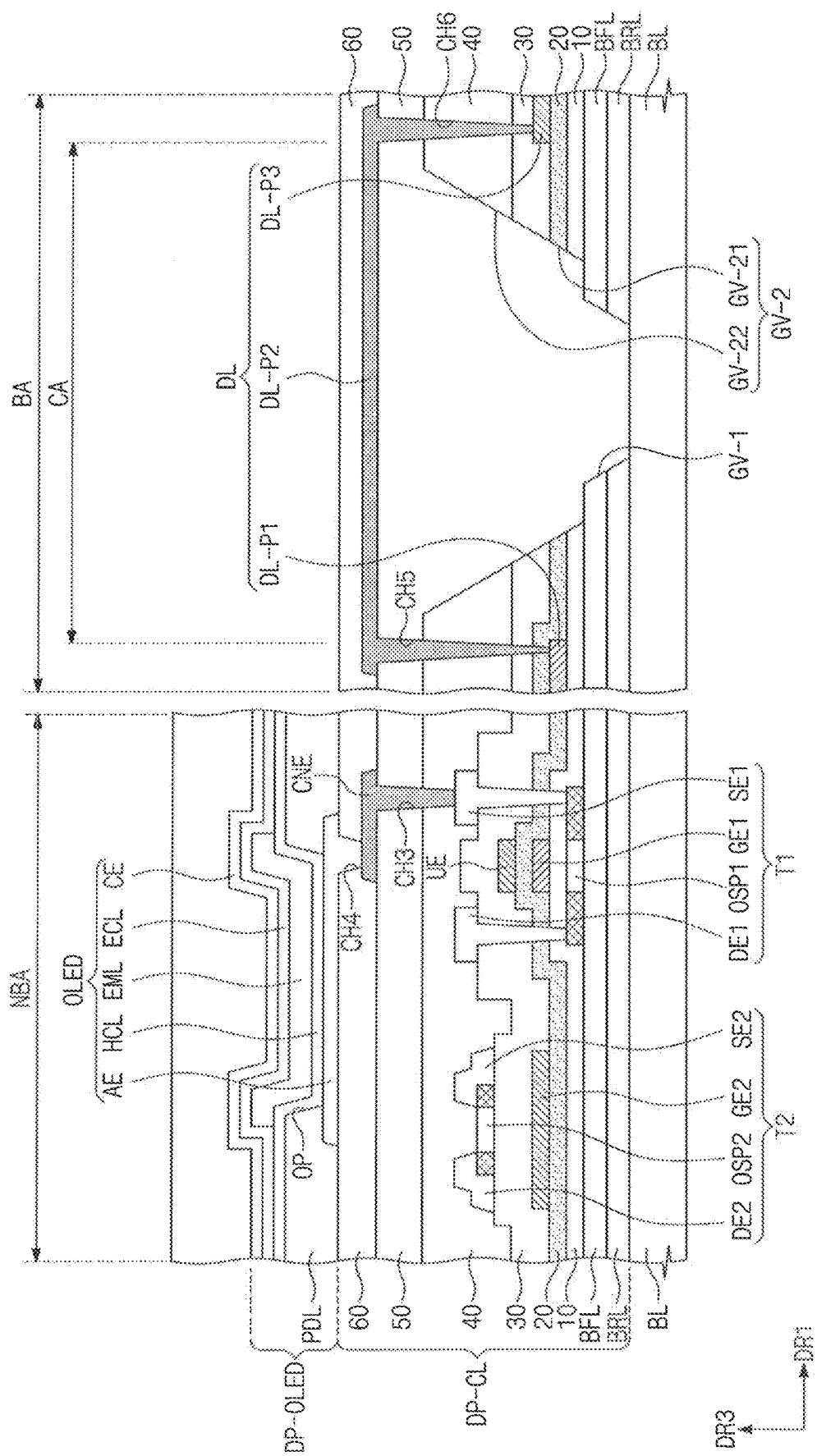

Referring to FIG. 8E, the first portion DL-P1 may be formed through the same process as that of the first control electrode GE1 and may be disposed on the same layer as that of the first control electrode GE1. The third portion DL-P3 may be formed through the same process as that of the upper electrode UE and may be disposed on the same layer as that of the upper electrode UE. The fifth contact hole CH5 may pass through the second insulation layer 20, the third insulation layer 30, the fourth insulation layer 40, and the fifth insulation layer 50, and the sixth contact hole CH6 may pass through the third insulation layer 30, the fourth insulation layer 40, and the fifth insulation layer 50.

Although the second portion DL-P2 may be formed through the same process as that of the connection electrode CNE and may be disposed on the same layer as that of the connection electrode CNE, exemplary embodiments of the present invention are not limited thereto. The second portion DL-P2 may be formed through the same process as that of the anode AE and may be disposed on the same layer as that of the anode AE. Referring to FIG. 9, the display panel DP may include a light blocking pattern LSP disposed between the fifth insulation layer 50 and the sixth insulation layer 60 and overlapping the second semiconductor pattern OSP2 (e.g., along the third direction DR3, which may be orthogonal to the upper surface of the base layer BL).

The light blocking pattern LSP may include a material having a relatively high light absorption rate or a relatively high light reflection rate. The light blocking pattern LSP may be disposed above the second semiconductor pattern OSP2 to block light that is generated from the organic light emitting diode OLED and then reflected from being incident into the second semiconductor pattern OSP2.

The light blocking pattern LSP may include a same material as that of the connection electrode CNE. For example, the light blocking pattern LSP may include a metal.

As described above, the leakage current of the switching transistor may decrease. Thus, the accuracy and reliability of the voltage-current of the driving transistor may be increased. As the input electrode and the output electrode of the driving transistor, which are disposed on the same layer as that of the input electrode and the output electrode of the switching transistor, may be directly connected to the silicon semiconductor pattern through the contact hole passing through the insulation layers, an occurrence of a misalignment may be reduced or eliminated.

As the opening may be defined in the inorganic layers of the bending area, and the organic layer may be disposed in the corresponding opening, the bending area of the display panel may have increased flexibility. As the organic layer may be disposed in each of the bending area and the non-bending area, the display panel may have a simplified structure (e.g., may be manufactured using a relatively lower number of etching masks).

As the process of forming the contact hole exposing a portion of the semiconductor pattern disposed on the display area and the process of removing the insulation layer of the bending area may be performed in the single process, the number of masks used in the manufacturing process may decrease. As the input electrode and the output electrode of the switching transistor and the input electrode and the output electrode of the driving transistor may be formed by the single process, the manufacturing process may be simplified.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display panel comprising:
    a base layer comprising a first area and a second area extending from the first area and bent from the first area;
    at least one inorganic layer overlapping the first area and the second area, wherein the at least one inorganic layer is disposed on the base layer, and wherein the at least one inorganic layer comprises a lower opening overlapping the second area;
    a first thin-film transistor disposed on the at least one inorganic layer and comprising a silicon semiconductor pattern overlapping the first area;
    a second thin-film transistor disposed on the at least one inorganic layer, and wherein the second thin-film transistor comprises an oxide semiconductor pattern overlapping the first area;
    a plurality of insulation layers overlapping the first area and the second area, wherein the plurality of insulation layers comprises an upper opening extending from the lower opening;
    a signal line electrically connected to the second thin-film transistor;
    an organic layer overlapping the first area and the second area, wherein the organic layer is disposed in the lower opening and the upper opening; and
    a light emitting element disposed on the organic layer and overlapping the first area.

2. The display panel of claim 1, wherein a portion of the signal line, which overlaps the second area, is disposed on the organic layer.

3. The display panel of claim 1, further comprising a connection electrode disposed on the organic layer and connected to an output electrode of the first thin-film transistor through a contact hole formed in the organic layer.

4. The display panel of claim 3, further comprising a passivation layer disposed on the organic layer.

5. The display panel of claim 4, wherein an electrode of the light emitting element is connected to the connection electrode through a contact hole formed in the passivation layer.

6. The display panel of claim 4, wherein the passivation layer is disposed on the signal line, and a portion of the passivation layer, which overlaps the second area, is in direct contact with the signal line.

7. The display panel of claim 1, wherein the insulation layers comprise:
    a first insulation layer substantially covering an upper surface of the silicon semiconductor pattern of the first thin-film transistor;
    a second insulation layer disposed on the first insulation layer and substantially covering upper and side surfaces of a control electrode of the first thin-film transistor;
    a third insulation layer disposed on the second insulation layer and substantially covering upper and side surfaces of a control electrode of the second thin-film transistor; and
    a fourth insulation layer disposed on the third insulation layer and substantially covering upper and side surfaces of an input electrode of the second thin-film transistor, substantially covering upper and side surfaces of an output electrode of the second thin-film transistor, and substantially covering an upper surface of the oxide semiconductor pattern of the second thin-film transistor.

8. The display panel of claim 7, wherein a first portion and a second portion of the oxide semiconductor pattern are disposed on the input electrode and the output electrode of the second thin-film transistor, respectively.

9. The display panel of claim 7, wherein the input electrode and the output electrode of the second thin-film transistor are disposed above a first portion and a second portion of the oxide semiconductor pattern, respectively, and a third portion of the oxide semiconductor pattern is exposed from the input electrode and the output electrode of the second thin-film transistor.

10. The display panel of claim 7, further comprising an upper electrode disposed between the second insulation layer and the third insulation layer and overlapping the control electrode of the first thin-film transistor.

11. The display panel of claim 1, further comprising a light blocking pattern disposed on the organic layer and overlapping the oxide semiconductor pattern of the second thin-film transistor.

12. The display panel of claim 1, wherein the at least one inorganic layer comprises silicon oxide layers and silicon nitride layers disposed alternately with the silicon oxide layers.

13. The display panel of claim 1, wherein a portion of a top surface of the at least one inorganic layer is in direct contact with the organic layer.

\* \* \* \* \*